United States Patent
Preisler et al.

(10) Patent No.: US 11,296,482 B2
(45) Date of Patent: Apr. 5, 2022

(54) SEMICONDUCTOR STRUCTURE HAVING GROUP III-V CHIPLET ON GROUP IV SUBSTRATE AND CAVITY IN PROXIMITY TO HEATING ELEMENT

(71) Applicant: Newport Fab, LLC, Newport Beach, CA (US)

(72) Inventors: Edward Preisler, San Clemente, CA (US); Farnood Rezaie, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 16/830,744

(22) Filed: Mar. 26, 2020

(65) Prior Publication Data

US 2021/0218225 A1    Jul. 15, 2021

Related U.S. Application Data

(63) Continuation-in-part of application No. 16/828,868, filed on Mar. 24, 2020, and a continuation-in-part of
(Continued)

(51) Int. Cl.
*H01S 5/02* (2006.01)
*H01S 5/06* (2006.01)
(Continued)

(52) U.S. Cl.
CPC ............ *H01S 5/0612* (2013.01); *H01S 5/021* (2013.01); *H01S 5/0203* (2013.01);
(Continued)

(58) Field of Classification Search
CPC ...... H01S 5/0203; H01S 5/021; H01S 5/0218; H01S 5/0612; G02B 6/132; G02B 6/136; G02B 2006/12061; G02B 2006/12135
See application file for complete search history.

(56) References Cited

U.S. PATENT DOCUMENTS 5,937,274 A    8/1999    Kondow et al.
5,963,828 A    10/1999    Allman et al.
(Continued)

FOREIGN PATENT DOCUMENTS

CN    102487046 A    6/2012

OTHER PUBLICATIONS

Adil Masood, et al. Comparison of Heater Architectures for Thermal Control of Silicon Photonic Circuits. Photonics Research Group, Ghent University—imec, Department of Information Technology Center of Nano- and Biophotonics (NB-photonics), Ghent, Belgium. 2013. pp. 1-2.

(Continued)

*Primary Examiner* — Michael Carter
(74) *Attorney, Agent, or Firm* — Farjami & Farjami LLP

(57) ABSTRACT

A semiconductor structure includes a group III-V chiplet over a group IV substrate. A group IV optoelectronic device is situated in the group IV substrate. A patterned group III-V optoelectronic device is situated in the group III-V chiplet. A heating element is near the group IV optoelectronic device, or alternatively, near the patterned group III-V optoelectronic device. A dielectric layer is over the patterned group III-V optoelectronic device. A venting hole is in the dielectric layer in proximity of the heating element. A cavity is in the group IV substrate in proximity to the heating element.

20 Claims, 22 Drawing Sheets

Related U.S. Application Data application No. 16/792,551, filed on Feb. 17, 2020, and a continuation-in-part of application No. 16/745,805, filed on Jan. 17, 2020, and a continuation-in-part of application No. 16/741,565, filed on Jan. 13, 2020, and a continuation-in-part of application No. 16/740,173, filed on Jan. 10, 2020.

(51) Int. Cl.
*G02B 6/12* (2006.01)
*G02B 6/136* (2006.01)
*G02B 6/132* (2006.01)

(52) U.S. Cl.
CPC ............ *H01S 5/0218* (2013.01); *G02B 6/132* (2013.01); *G02B 6/136* (2013.01); *G02B 2006/12061* (2013.01); *G02B 2006/12135* (2013.01)

(56) References Cited

U.S. PATENT DOCUMENTS

| | | |
|---|---|---|
| 6,645,829 B2 | 11/2003 | Fitzergald |
| 7,834,456 B2 | 11/2010 | Tabatabaie et al. |
| 8,633,496 B2 | 1/2014 | Hata et al. |
| 9,318,437 B1 | 4/2016 | He et al. |
| 9,331,076 B2 | 5/2016 | Bayram et al. |
| 2004/0124424 A1 | 7/2004 | Tatsumi |
| 2009/0016399 A1 | 1/2009 | Bowers |
| 2011/0095331 A1 | 4/2011 | Hanawa et al. |
| 2012/0074980 A1 | 3/2012 | Choi et al. |
| 2012/0288971 A1 | 11/2012 | Bogaerts et al. |
| 2015/0075599 A1* | 3/2015 | Yu ................... H01L 31/03529 136/256 |
| 2016/0105247 A1 | 4/2016 | Cheng et al. |
| 2016/0148959 A1 | 5/2016 | Cheng et al. |
| 2019/0189603 A1 | 6/2019 | Wang et al. |
| 2019/0391328 A1 | 12/2019 | Li et al. |
| 2020/0274321 A1 | 8/2020 | Ghegin et al. |

OTHER PUBLICATIONS

Thomas Ferrotti. Design, Fabrication and Characterization of a Hybrid III-V on Silicon Transmitter for High-Speed Communications. Other. Université de Lyon, 2016. English. NNT : 2016LYSEC054. tel-01529424. pp. 1-181.

Elodie Ghegin "Integration of Innovative Ohmic Contacts for Heterogeneous III-V/Silicon Photonic Devices" HAL Jan. 16, 2018. pp. 1-295.

\* cited by examiner

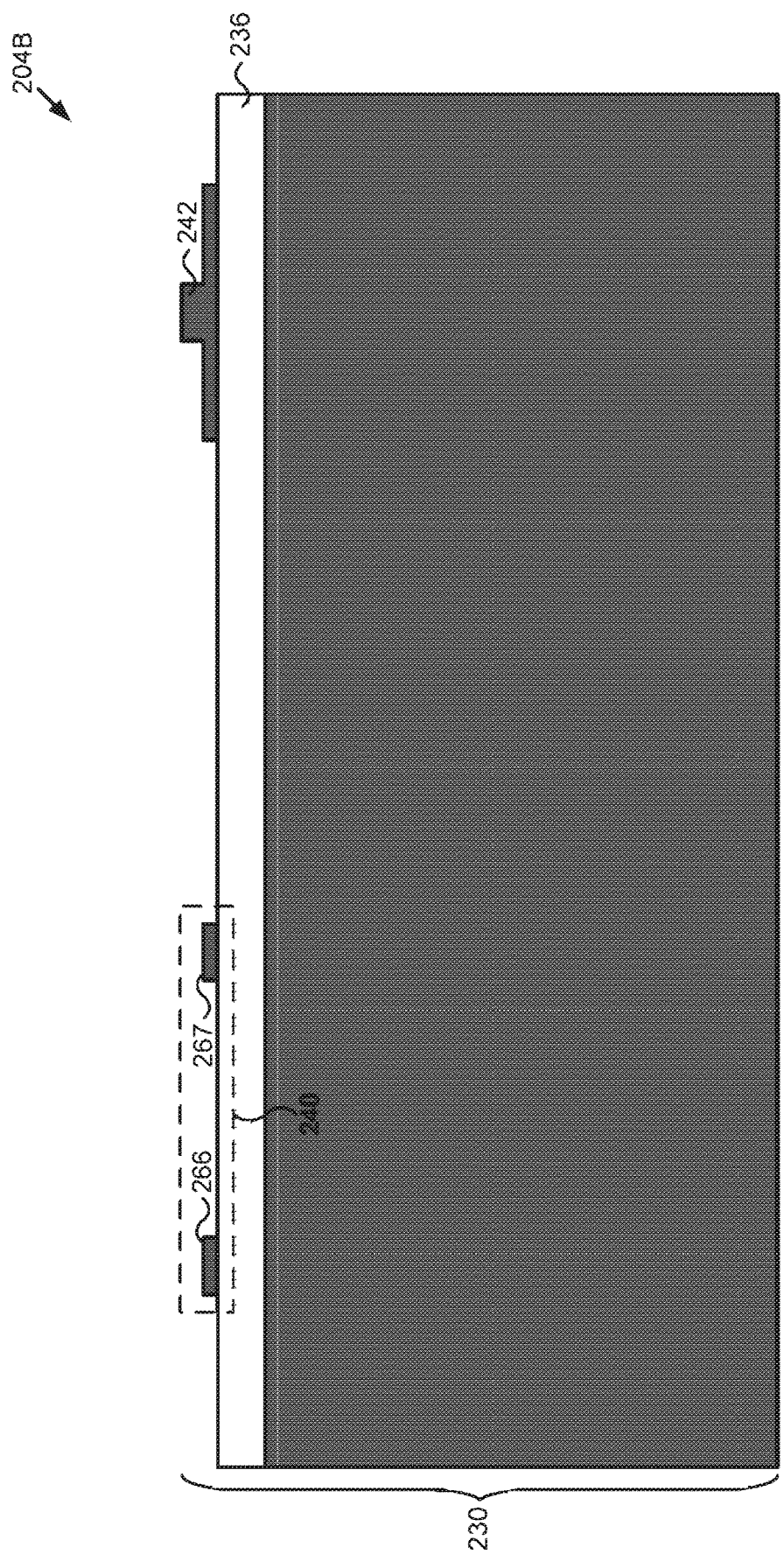

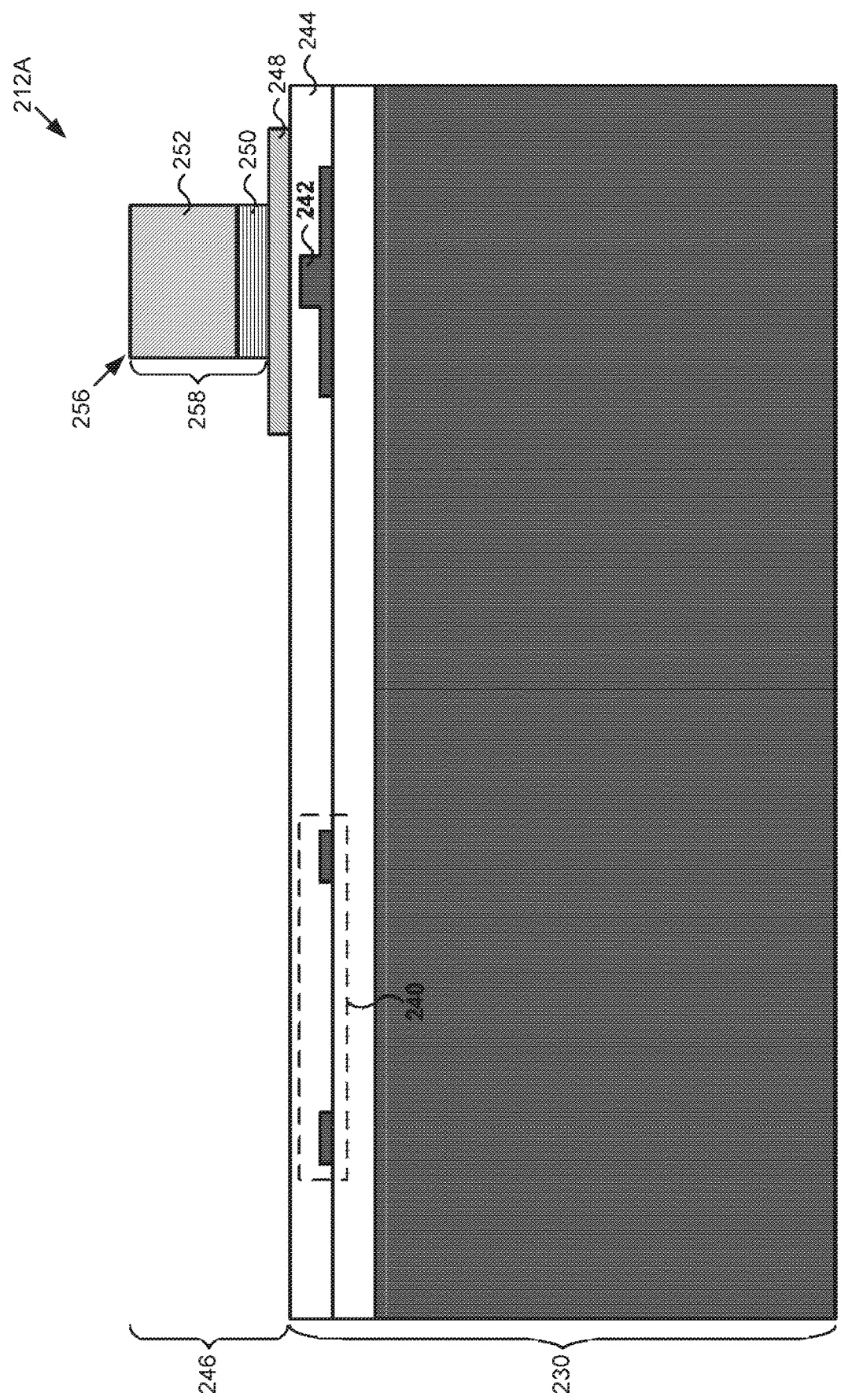

SEMICONDUCTOR STRUCTURE HAVING GROUP III-V CHIPLET ON GROUP IV SUBSTRATE AND CAVITY IN PROXIMITY TO HEATING ELEMENT

CLAIMS OF PRIORITY

The present application is a continuation-in-part of and claims the benefit of and priority to application Ser. No. 16/740,173 filed on Jan. 10, 2020 and titled "Semiconductor Structure Having Group III-V Device on Group IV Substrate and Contacts with Precursor Stacks,". The present application is also a continuation-in-part of and claims the benefit of and priority to application Ser. No. 16/741,565 filed on Jan. 13, 2020 and titled "Semiconductor Structure Having Group III-V Device on Group IV Substrate and Contacts with Liner Stacks,". The present application is also a continuation-in-part of and claims the benefit of and priority to application Ser. No. 16/745,805 filed on Jan. 17, 2020 and titled "Semiconductor Structure Having Group III-V Device on Group IV Substrate,". The present application is further a continuation-in-part of and claims the benefit of and priority to application Ser. No. 16/792,551 filed on Feb. 17, 2020 and titled "Structure and Method for Process Control Monitoring for Group III-V Devices Integrated with Group IV Substrate,". The present application is also a continuation-in-part of and claims the benefit of and priority to application Ser. No. 16/828,868 filed on Mar. 24, 2020 and titled "Fabrication of Semiconductor Structure Having Group III-V Device on Group IV Substrate with Separately Formed Contacts Using Different Metal Liners,". The disclosures and contents of the above-identified applications are hereby incorporated fully by reference into the present application.

BACKGROUND

Group III-V compound semiconductors including at least one group III element, such as indium (In), gallium (Ga), aluminum (Al), and boron (B), and at least one group V element, such as arsenic (As), phosphorus (P), and nitrogen (N), have characteristics that make them advantageous for use in optoelectronic devices. However, operations that are incidental to and supportive of these optoelectronic devices, such as feedback, modulation, and input/output coupling, may be more easily implemented using group IV semiconductors, such as silicon.

Variations associated with operation of optoelectronic devices and/or normal variations associated with fabrication can result in the group IV devices failing to perform their intended operations. In one approach, the thermo-optical effect is used to compensate for variations by heating a group IV device to adjust its refractive index. However, heat from a heating element can easily dissipate in a group IV substrate. In order to achieve a desired refractive index in the group IV device, the heating element may require significant supplied power.

Conventional techniques for reducing heat dissipation employ backside etching of a group IV substrate. However, backside etching can be difficult to align with a heating element on a front side of the group IV substrate. Compensating for inaccurate alignment by etching large volumes can reduce mechanical stability of the group IV substrate. Reducing heat dissipation also increases complexity when integrating group III-V devices with group IV devices, as group III-V devices often require increased heat dissipation to avoid overheating. Forming group III-V devices separately from group IV devices could cause significant optical and/or electrical losses when coupling the group III-V devices and the group IV devices.

Thus, there is need in the art for efficiently and effectively integrating group III-V and group IV devices with improved optical and/or electrical performance, improved thermal management, and reduced optical and/or electrical losses and complexity.

SUMMARY

The present disclosure is directed to a semiconductor structure having a group III-V chiplet on a group IV substrate and a cavity in proximity to a heating element, substantially as shown in and/or described in connection with at least one of the figures, and as set forth in the claims.

BRIEF DESCRIPTION OF THE DRAWINGS

FIG. 3B illustrates a cross-sectional view of a portion of a semiconductor structure corresponding to FIG. 3A processed in accordance with the flowchart of FIG. 1A according to one implementation of the present application.

FIG. 7A illustrates a cross-sectional view of a portion of a semiconductor structure processed in accordance with the flowchart of FIG. 1B according to one implementation of the present application.

DETAILED DESCRIPTION

Figure 1A:
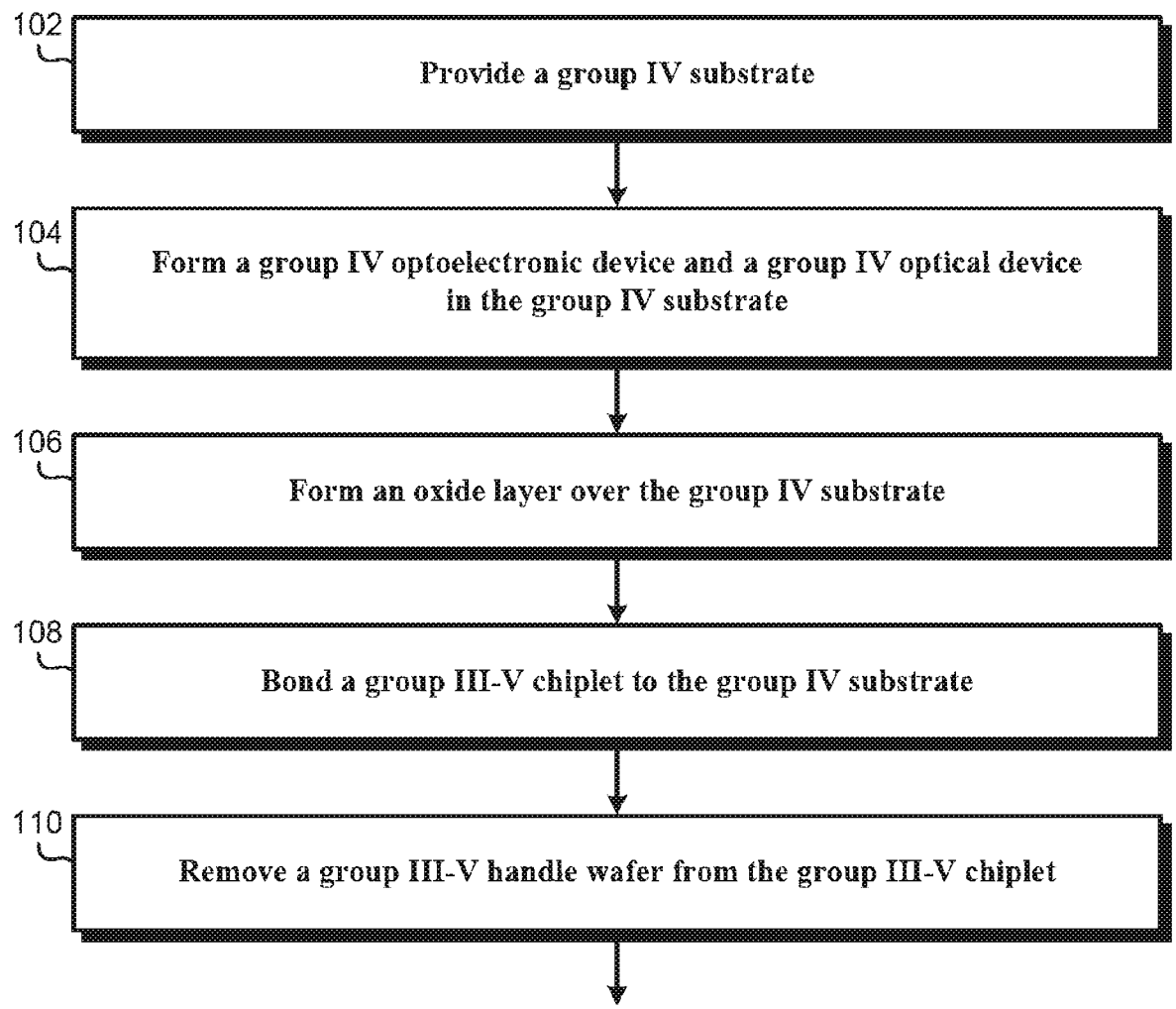
FIG. 1A illustrates a portion of a flowchart of an exemplary method for manufacturing a semiconductor structure according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 2:
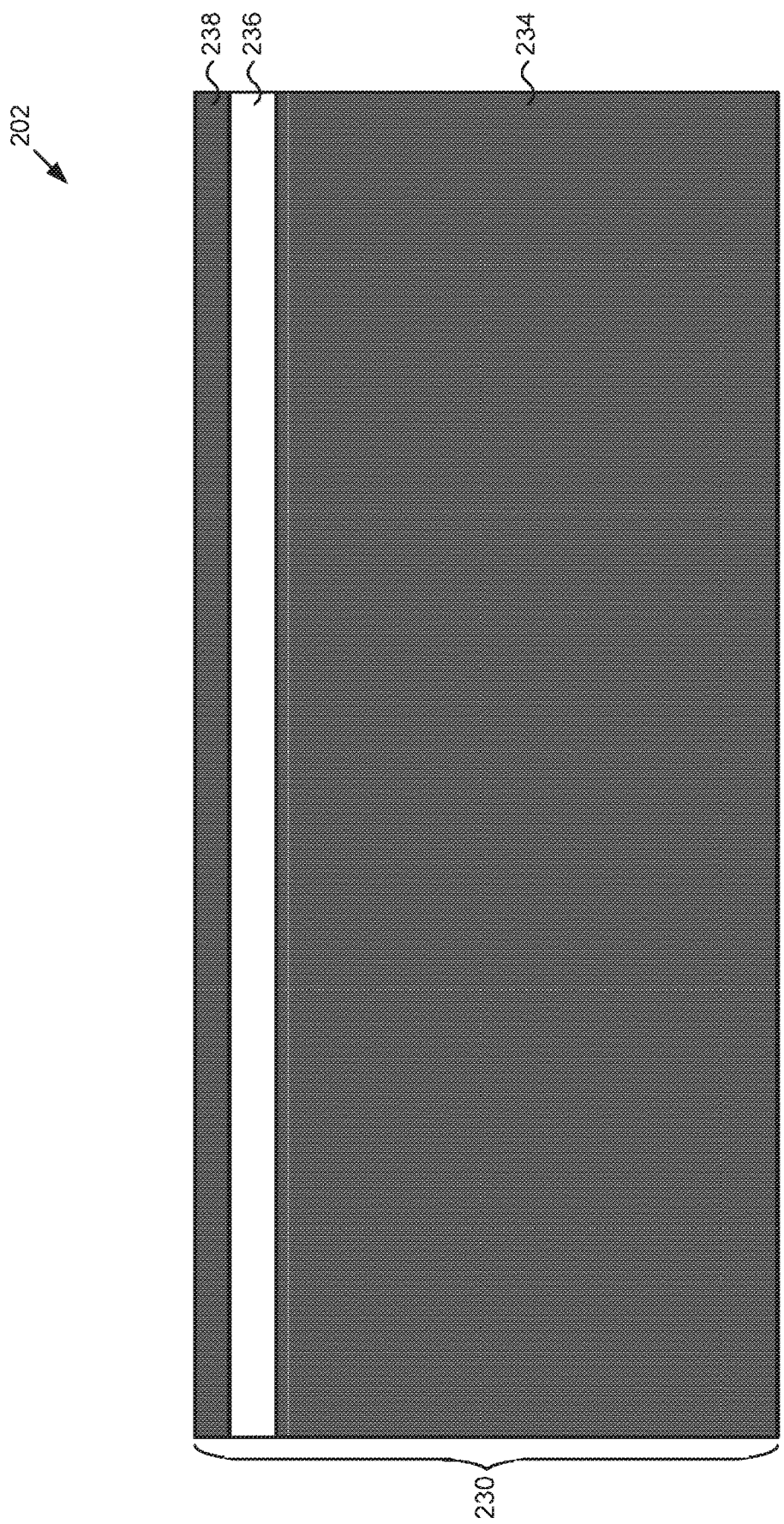
FIG. 2 illustrates a cross-sectional view of a portion of a semiconductor structure processed in accordance with the flowchart of FIG. 1A according to one implementation of the present application.
Figure 3A:
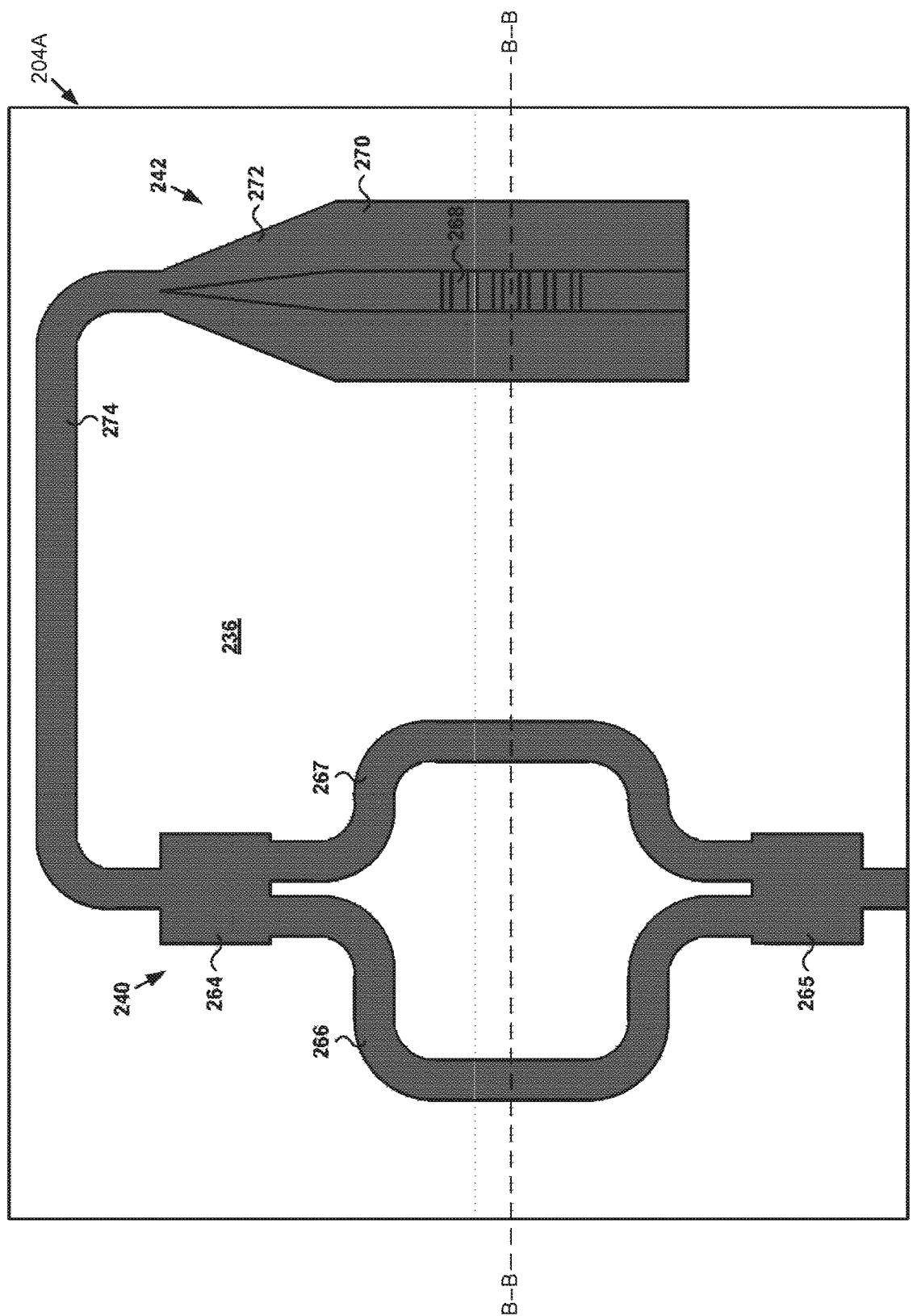
FIG. 3A illustrates a layout of a portion of a semiconductor structure processed in accordance with the flowchart of FIG. 1A according to one implementation of the present application.
Figure 4:
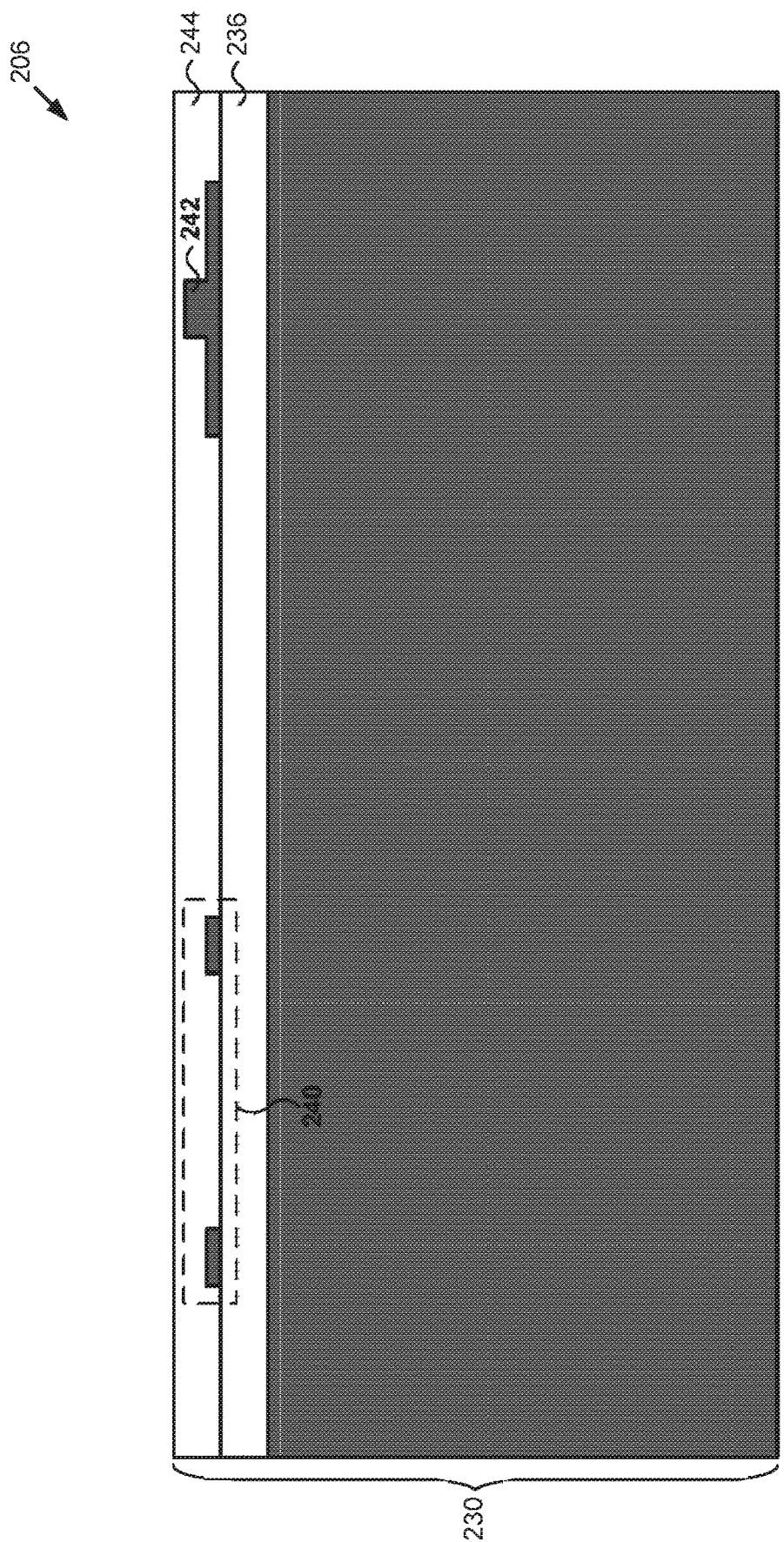
FIG. 4 illustrates a cross-sectional view of a portion of a semiconductor structure processed in accordance with the flowchart of FIG. 1A according to one implementation of the present application.

FIG. 1A illustrates a portion of a flowchart of an exemplary method for manufacturing a semiconductor structure according to one implementation of the present application. Structures shown in FIGS. 2 through 6 illustrate the results of performing actions 102 through 110 shown in the flowchart of FIG. 1A. For example, FIG. 2 shows a semiconductor structure after performing action 102 in FIG. 1A, FIG. 3A shows a semiconductor structure after performing action 104 in FIG. 1A, FIG. 4 shows a semiconductor structure after performing action 106 in FIG. 1A, and so forth.

Figure 1B:
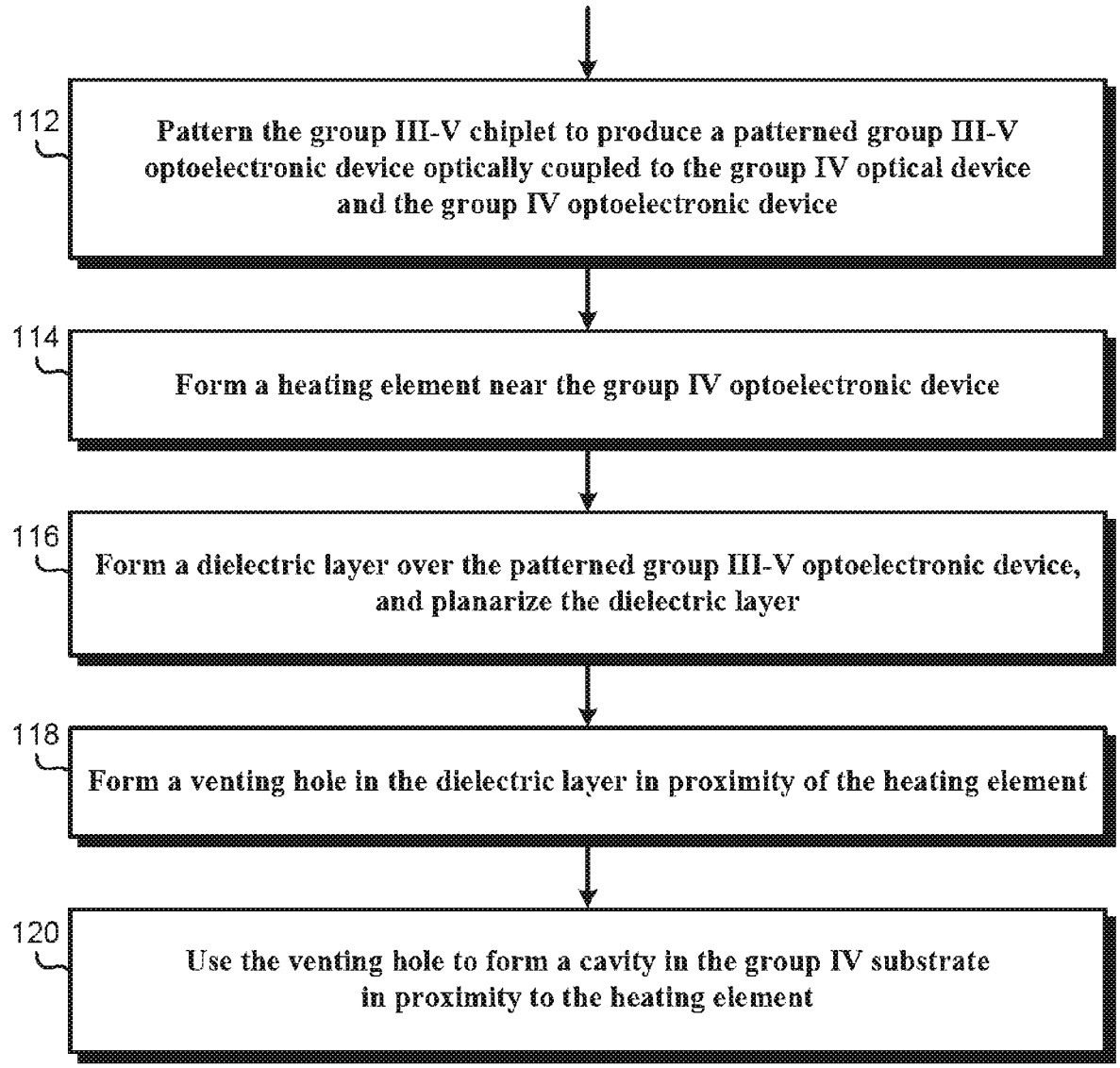
FIG. 1B illustrates a portion of a flowchart of an exemplary method for manufacturing a semiconductor structure, as a continuation to the flowchart of FIG. 1A, according to one implementation of the present application.

FIG. 1B illustrates a portion of a flowchart of an exemplary method for manufacturing a semiconductor structure, as a continuation to the flowchart of FIG. 1A, according to one implementation of the present application. Structures shown in FIGS. 7A through 11B illustrate the results of performing actions 112 through 120 shown in the flowchart of FIG. 1B. For example, FIG. 7A shows a semiconductor structure after performing action 112 in FIG. 1B, Figure SA shows a semiconductor structure after performing action 114 in FIG. 1B, FIG. 9 shows a semiconductor structure after performing action 116 in FIG. 1B, and so forth.

Actions 102 through 120 shown in the flowcharts of FIGS. 1A and 1B are sufficient to describe one implementation of the present inventive concepts. Other implementations of the present inventive concepts may utilize actions different from those shown in the flowcharts of FIGS. 1A and 1B. Certain details and features have been left out of the flowcharts of FIGS. 1A and 1B that are apparent to a person of ordinary skill in the art. For example, an action may consist of one or more sub-actions or may involve specialized equipment or materials, as known in the art. Moreover, some actions, such as masking and cleaning actions, may be omitted so as not to distract from the illustrated actions.

FIG. 2 illustrates a cross-sectional view of a portion of a semiconductor structure processed in accordance with action 102 in the flowchart of FIG. 1A according to one implementation of the present application. As shown in FIG. 2, semiconductor structure 202 is provided. Semiconductor structure 202 includes group IV substrate 230. As used herein, the phrase "group IV" refers to a semiconductor material that includes at least one group IV element such as silicon (Si), germanium (Ge), and carbon (C), and may also include compound semiconductors such as silicon germanium (SiGe) and silicon carbide (SiC), for example. "Group V" also refers to semiconductor materials that include more than one layer of group IV elements, or doping of group IV elements to produce strained group IV materials, and may also include group IV based composite substrates such as silicon on insulator (SOI) substrates, separation by implantation of oxygen (SIMOX) process substrates, and silicon on sapphire (SOS) substrates, for example.

In the present implementation, group IV substrate 230 is an SOI substrate including handle wafer 234, buried oxide (BOX) 236, and top semiconductor 238. In providing semiconductor structure 202, a bonded and etch back SOI (BESOI) process can be used, as known in the art. In a BESOI process, handle wafer 234, BOX 236, and top semiconductor 238 together form an SOI substrate. Alternatively, as also known in the art, a SIMOX process (separation by implantation of oxygen process) or a "smart cut" process can also be used for providing semiconductor structure 202. In a SIMOX process, handle wafer 234 can be a bulk silicon support wafer (which for ease of reference, may still be referred to as a "handle wafer" in the present application). Similar to a BESOI process, in both SIMOX and smart cut processes, handle wafer 234, BOX 236, and top semiconductor 238 together form an SOI substrate.

In one implementation, handle wafer 234 is undoped silicon. In various implementations, handle wafer 234 has a thickness of approximately seven hundred microns (700 µm) or greater or less. In one implementation, a trap rich layer can be situated between handle wafer 234 and BOX 236. In various implementations, BOX 236 typically comprises silicon dioxide ($SiO_2$), but it may also comprise silicon nitride ($Si_xN_y$), or another insulator material. In various implementations, BOX 236 has a thickness of approximately one micron (1 µm) or greater or less. In one implementation, top semiconductor 238 includes doped silicon. In various implementations, top semiconductor 238 has a thickness of approximately three hundred nanometers (300 nm) or greater or less. Handle wafer 234, BOX 236, and top semiconductor 238 can be provided together in group IV substrate 230 as a pre-fabricated SOI substrate. In various implementations, as discussed above, group IV substrate 230 may be any other group IV substrate. As described below, group IV substrate 230 can include group IV devices (not shown in FIG. 2).

FIG. 3A illustrates a layout of a portion of a semiconductor structure processed in accordance with action 104 in the flowchart of FIG. 1A according to one implementation of the present application. As shown in FIG. 3A, in semiconductor structure 204A, group IV optoelectronic device 240 and group IV optical device 242 are formed.

In the present implementation, group IV optoelectronic device 240 and group IV optical device 242 are formed in group IV substrate 230 (shown in FIG. 2) by patterning top semiconductor 238 (shown in FIG. 2). Portions of top semiconductor 238 are also removed to isolate group IV optoelectronic device 240 and group IV optical device 242, exposing portions of BOX 236. In other implementations, dedicated isolation structures can be used.

Group IV optoelectronic device 240 is a group IV device having optical input/output terminals, or having both electrical and optical input/output terminals. In the present implementation, group IV optoelectronic device 240 is a Mach-Zender interferometer and includes input splitter 264, arms 266 and 267, and output combiner 265. Light passes through input splitter 264, propagates in arms 266 and 267, and is then recombined in a single waveguide at output combiner 265. According to the phase difference between the two arms 266 and 267, the signals will interfere differently depending on the wavelength of the light, leading to a change in the intensity of the output signal. Group IV optoelectronic device 240 can have different dimensions and/or can include different structures than those shown in FIG. 3A. In the present implementation, arms 266 and 267 have different lengths and group IV optoelectronic device 240 is an asymmetric interferometer. In another implementation, group IV optoelectronic device 240 can be a symmetric interferometer. In various implementations, group IV optoelectronic device 240 can be a Michelson interferometer, a grating coupler, a reflector, or any other types of group IV optoelectronic devices that experience the thermo-optical effect described below.

Group IV optical device 242 is a group IV device having optical input/output terminals. In the present implementation, group IV optoelectronic device 240 is a waveguide and includes grating ridge 268, planar portion 270, tapered portion 272, and narrow portion 274. Group IV optical device 242 couples light into the plane shown in FIG. 3A, such that the light can be optically coupled to group IV optoelectronic device 240. Group IV optoelectronic device 240 can be optically connected to additional group IV devices (not shown in FIG. 3A) and/or to an optical output/input interface (not shown in FIG. 3A). It is noted that the optical coupling in FIG. 3A is bidirectional, and group IV optical device 242 can provide light received from group IV optoelectronic device 240. Group IV optical device 242 can have different dimensions and/or can include different structures than those shown in FIG. 3A. In various implementations, group IV optical device 242 can be any other type of group IV optical devices.

In various implementations, semiconductor structure 204A can include greater or fewer group IV optoelectronic devices 240 and/or group IV optical devices 242 than shown, by way of example, in FIG. 3A. In various implementations, group IV optoelectronic device 240 and/or group IV optical device 242 can have any other shapes and/or arrangements. For example, group IV optical device 242 may also be optically coupled to another optoelectronic device. In various implementations, other group IV devices (not shown in FIG. 3A), such as transistors, operational amplifiers, drivers, filters, mixers, diodes, active circuits, and/or passive devices, can be integrated in semiconductor structure 204A.

FIG. 3B illustrates a cross-sectional view of a portion of a semiconductor structure corresponding to FIG. 3A processed in accordance with action 104 in the flowchart of FIG. 1A according to one implementation of the present application. FIG. 3B represents a cross-sectional view along line "B-B" in FIG. 3A. As shown in FIG. 3B, in semiconductor structure 204B, group IV optoelectronic device 240 and group IV optical device 242 are formed in group IV substrate 230 over BOX 236. In particular, cross-sectional views of arms 266 and 267 of group IV optoelectronic device 240 are shown.

FIG. 4 illustrates a cross-sectional view of a portion of a semiconductor structure processed in accordance with action 106 in the flowchart of FIG. 1A according to one implementation of the present application. As shown in FIG. 4, in semiconductor structure 206, oxide layer 244 is formed over group IV substrate 230.

In group IV substrate 230, oxide layer 244 is situated over group IV optoelectronic device 240, group IV optical device 242, and portions of BOX 236. In various implementations, oxide layer 244 can comprise silicon oxide ($SiO_2$), silicon onynitride ($Si_xO_yN_z$), or another dielectric. In various implementations, the height of oxide layer 244 above group IV optical device 242 can be approximately one hundred nanometers (100 nm). Oxide layer 244 protects group IV optoelectronic device 240 and group IV optical device 242, and facilitates a subsequent bonding action.

Figure 5:
FIG. 5 illustrates a cross-sectional view of a portion of a semiconductor structure processed in accordance with the flowchart of FIG. 1A according to one implementation of the present application.

FIG. 5 illustrates a cross-sectional view of a portion of a semiconductor structure processed in accordance with action 108 in the flowchart of FIG. 1A according to one implementation of the present application. As shown in FIG. 5, in semiconductor structure 208, group M-V chiplet 246 is bonded to group IV substrate 230.

Group III-V chiplet 246 includes doped group III-V layer 248, transition layers 250, doped group III-V layer 252, and group III-V handle wafer 254. Prior to bonding to group IV substrate 230, group III-V chiplet 246 can be fabricated by sequential epitaxial growth of doped group M-V layer 252, transition layers 250, and doped group III-V layer 248 on group III-V handle wafer 254. In various implementations, group III-V handle wafer 254 can be InP having a thickness of approximately two hundred microns (200 µm) or greater or less.

In the present implementation, doped group M-V layer 252 comprises InGaAs implanted with boron or another appropriate P type dopant. In various implementations, doped group III-V layer 252 has a thickness of approximately two microns (2 µm) or greater or less. As known in the art, doped group III-V layer 252 can comprise a thin heavily doped contact layer near group III-V handle wafer 254 and a thick lightly doped cladding layer near transition layers 250. In various implementations, doped group III-V layer 252 can include other group III-V materials instead of or in addition to InGaAs.

In the present implementation, transition layers 250 comprise several undoped InGaAsP layers each having a thickness of approximately ten nanometers (10 nm). These layers function as quantum wells to provide optical gain. As known in the art, transition layers 250 can also comprise confinement layers around the quantum wells and having lower refractive index. In various implementations, transition layers 250 have a combined thickness of approximately two hundred nanometers (200 nm) or greater or less. In various implementations, transition layers 250 can include other group III-V materials instead of or in addition to InGaAsP.

Doped group III-V layer 248 is a group III-V layer having an opposite doping type than doped group III-V layer 252. In the present implementation, doped group III-V layer 248 comprises InP implanted with phosphorus or another appropriate N type dopant. In various implementations, doped group III-V layer 248 has a thickness of approximately one hundred nanometers (100 nm) or greater or less. In various implementations, doped group III-V layer 248 can include other group III-V materials instead of or in addition to InP.

Group III-V chiplet 246 can be bonded to group IV substrate 230 by oxygen plasma assisted direct wafer bonding. The surfaces of group III-V chiplet 246 and group IV substrate 230 can be cleaned, then activated by an oxygen plasma, then placed in physical contact at room temperature to bond. In one implementation, after bonding, a low-temperature anneal can also be performed. For example, semiconductor structure 208 can be annealed at a temperature of approximately three hundred degrees Celsius (300° C.).

In semiconductor structure 208, doped group III-V layer 252, transition layers 250, and doped group III-V layer 248 form a P-I-N junction. Thus, group III-V chiplet 246 is suitable for patterning into an optoelectronic device, such as a laser or photodiode. As described below, doped group III-V layers 248 and 252 can function as terminals of a group III-V laser. Although an example of N type doped group III-V layer 248 and P type doped group III-V layer 252 is described above, in one implementation, the dopant types can be switched (i.e., P type doped group III-V layer 248 and N type doped group III-V layer 252). In other implementations, group III-V chiplet 246 can have other layering suitable for other devices. In other implementations, some patterning may be performed prior to bonding. In semiconductor structure 208, group III-V chiplet 246 is shown to overlie group IV optoelectronic device 240, and group IV optical device 242. In other implementations, group III-V chiplet 246 may overlie more or fewer group IV devices of group IV substrate 230. For example, group IV optoelectronic device 240 can be situated in an area of semiconductor structure 208 that does not underlie group III-V chiplet 246.

Figure 6:
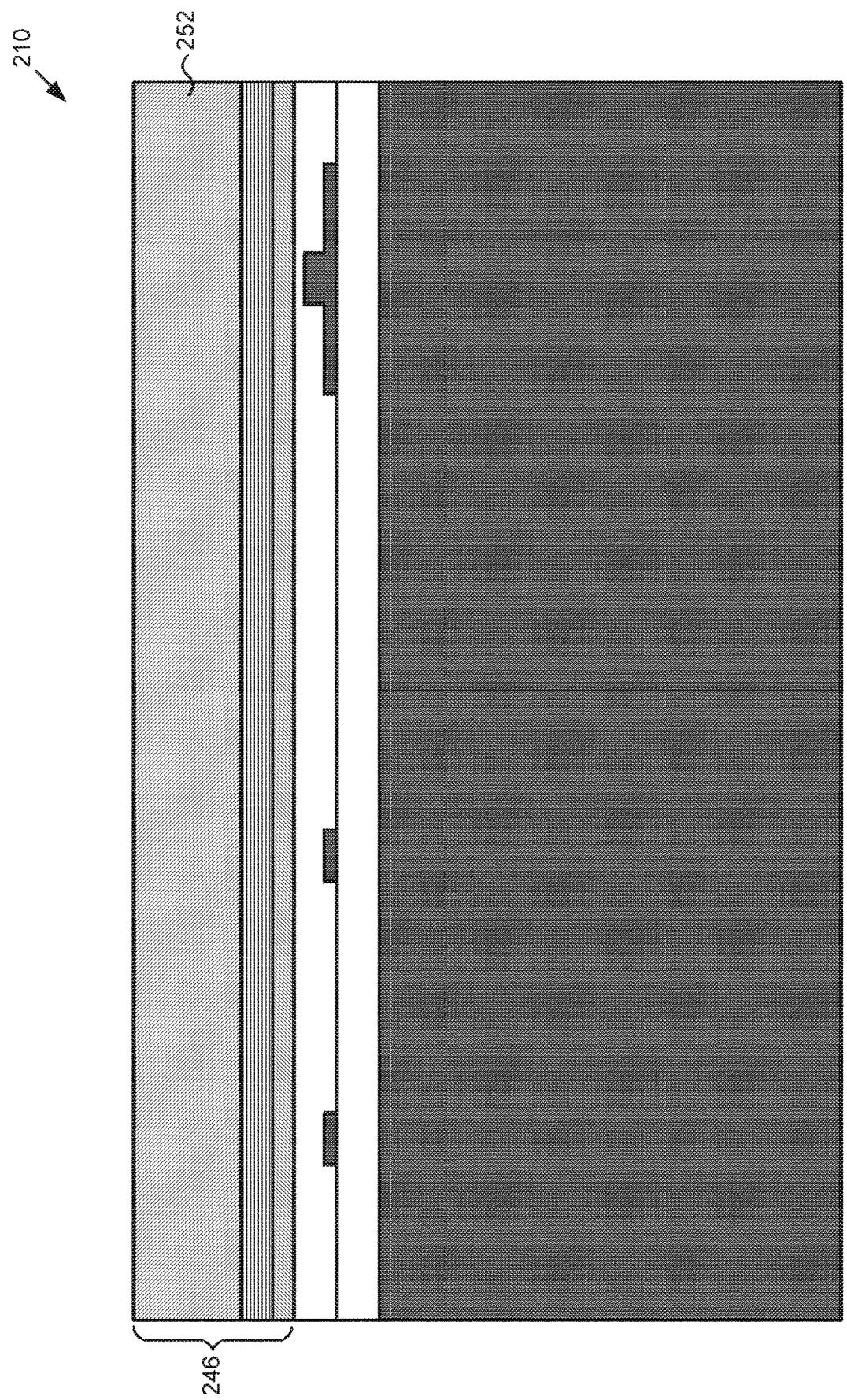
FIG. 6 illustrates a cross-sectional view of a portion of a semiconductor structure processed in accordance with the flowchart of FIG. 1A according to one implementation of the present application.

FIG. 6 illustrates a cross-sectional view of a portion of a semiconductor structure processed in accordance with action 110 in the flowchart of FIG. 1A according to one implementation of the present application. As shown in FIG. 6, in semiconductor structure 210, group III-V handle wafer 254 (shown in FIG. 5) is removed from group III-V chiplet 246.

Group III-V handle wafer 254 (shown in FIG. 5) can be removed using any means known in the art. For example, group III-V handle wafer 254 (shown in FIG. 5) can be removed by grinding and/or chemical mechanical polishing (CMP), followed by wet etching using a hydrogen chloride (HCl) mixture. In various implementations, group III-V handle wafer 254 (shown in FIG. 5) can be selectively etched while doped group III-V layer 252 or another sacrificial layer (not shown) performs as an etch stop.

FIG. 7A illustrates a cross-sectional view of a portion of a semiconductor structure processed in accordance with action 112 in the flowchart of FIG. 1B according to one implementation of the present application. As shown in FIG. 7A, in semiconductor structure 212A, group M-V chiplet 246 is patterned to produce patterned group III-V optoelectronic device 256.

Patterned group III-V optoelectronic device 256 can be formed by depositing and patterning a hardmask, for example a $Si_XN_Y$ hardmask, over doped group III-V layer 252, then etching doped group III-V layer 252 using a phosphorus (P) based wet etch. In this implementation, doped group III-V layer 252 may be selectively etched while transition layers 250 perform as an etch stop. Then transition layers 250 can be etched, for example, using a reactive ion etch (RIE). Finally, doped group III-V layer 248 can be etched, for example, by patterning another mask and using a bromine (Br) based wet etch.

In the present implementation, patterned group III-V optoelectronic device 256 is a group III-V laser, and doped group III-V layers 248 and 252 function as terminals of the laser. As shown in FIG. 7A, after forming patterned group III-V optoelectronic device 256, group III-V mesa 258 is situated over doped group III-V layer 248. Group III-V mesa 258 includes transition layers 250 and doped group III-V layer 252. In order for patterned group III-V optoelectronic device 256 to avoid significant optical losses, in various implementations, a height of group III-V mesa 258 may be approximately two microns (2 μm) or greater. In various implementations, patterned group III-V optoelectronic device 256 can be a photodiode, or any other type of group III-V optoelectronic devices. In various implementations, semiconductor structure 212A can include additional patterned group III-V devices (not shown in FIG. 7A) in group III-V chiplet 246.

Patterned group III-V optoelectronic device 256 is optically connected to group IV optical device 242 in group IV substrate 230. Patterned group i-V optoelectronic device 256 is approximately aligned with group IV optical device 242. Patterned group III-V optoelectronic device 256 is separated from group IV optical device 242 by a thin portion of oxide layer 244 that was utilized to protect group IV optoelectronic device 240 and group IV optical device 242 during bonding action 108 (shown in FIG. 5). As described above, in various implementations, group IV optical device 242 can be, for example, a waveguide. In one implementation, group IV optical device 242 may couple light to/from patterned group III-V optoelectronic device 256 from/to another plane not visible in the cross-sectional view of FIG. 7A. In another implementation, group IV optical device 242 may couple light to/from patterned group III-V optoelectronic device 256 from/to a bottom of group IV substrate 230. In various implementations, patterned group III-V optoelectronic device 256 can be optically connected to additional group IV devices (not shown in FIG. 7A) in group IV substrate 230. Similarly, group IV optical device 242 can be optically connected to additional group IV devices (not shown in FIG. 7A) in group IV substrate 230.

Figure 7B:
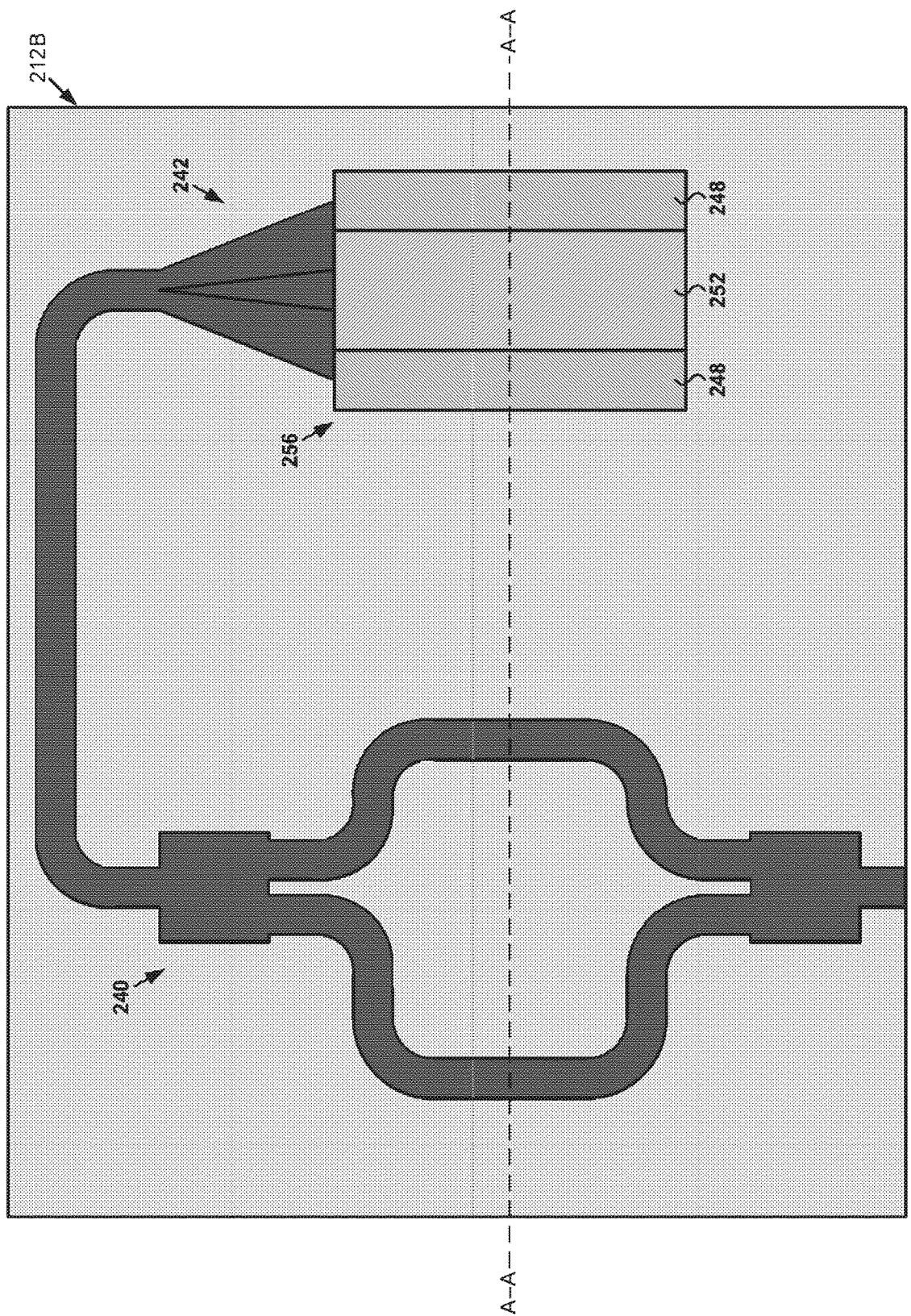
FIG. 7B illustrates a layout of a portion of a semiconductor structure corresponding to FIG. 7A processed in accordance with the flowchart of FIG. 1B according to one implementation of the present application.

FIG. 7B illustrates a layout of a portion of a semiconductor structure corresponding to FIG. 7A processed in accordance with action 112 in the flowchart of FIG. 1B according to one implementation of the present application. FIG. 7A represents a cross-sectional view along line "A-A" in FIG. 7B. As shown in FIG. 7B, in semiconductor structure 212B, group III-V chiplet 246 (shown in FIG. 7A) is patterned to produce patterned group III-V optoelectronic device 256. In particular, layout views of doped group III-V layers 248 and 252 of patterned group III-V optoelectronic device 256 are shown.

Light produced by patterned group III-V optoelectronic device 256 is optically coupled to group IV optical device 242, which in turn is optically coupled to group IV optoelectronic device 240. For purposes of clarity, specific means of contacting and driving patterned group III-V optoelectronic device 256 are not illustrated in FIG. 7B. In one implementation, light produced by patterned group III-V optoelectronic device 256 can be optically coupled to group IV optoelectronic device 240 directly, without group IV optical device 242.

Figure 8A:
FIG. 8A illustrates a cross-sectional view of a portion of a semiconductor structure processed in accordance with the flowchart of FIG. 1B according to one implementation of the present application.
Figure 9:
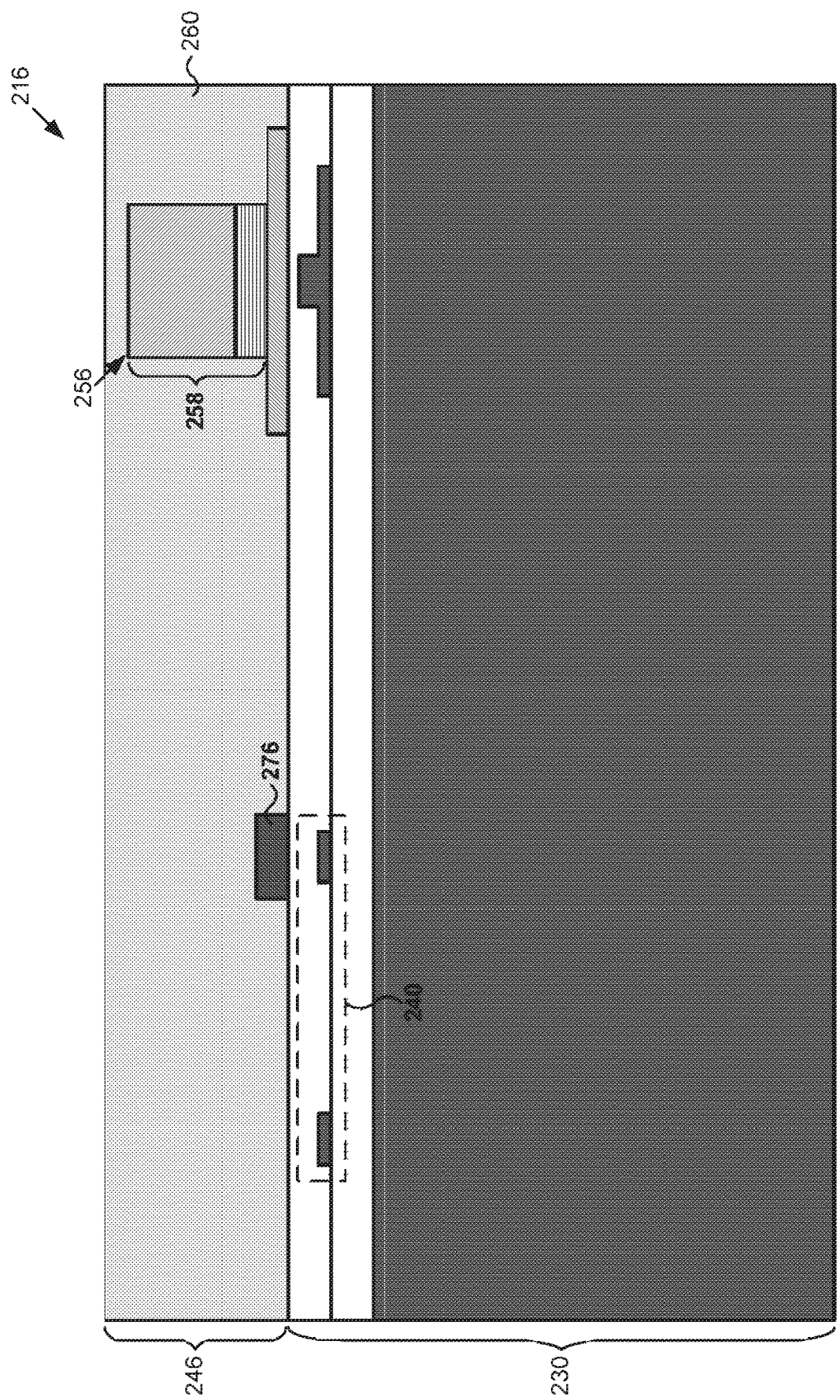
FIG. 9 illustrates a cross-sectional view of a portion of a semiconductor structure processed in accordance with the flowchart of FIG. 1B according to one implementation of the present application.

FIG. 8A illustrates a cross-sectional view of a portion of a semiconductor structure processed in accordance with action 114 in the flowchart of FIG. 1B according to one implementation of the present application. As shown in FIG. 8A, in semiconductor structure 214A, heating element 276 is formed near group IV optoelectronic device 240.

Heating element 276 can comprise any material capable of Joule heating. Preferably, heating element 276 comprises a material that exhibits minimal or substantially no electro-migration, thermal stress migration, and/or agglomeration. In various implementations, heating element 276 can comprise tungsten (W), molybdenum (Mo), titanium (Ti), titanium tungsten (TiW), titanium nitride (TiN), tantalum (Ta), tantalum nitride (TaN), nickel chromium (NiCr), or nickel chromium silicon (NiCrSi). Heating element 276 can be formed, for example, by a damascene process or a metal etch process.

Heating element 276 is situated in group III-V chiplet 246, over arm 267 of group IV optoelectronic device 240, and on oxide layer 244. As described below, heating element 276 can be connected to electrodes of a voltage source or current source (not shown in FIG. 8A) for providing voltage or current to heating element 276 to generate heat. For purposes of clarity, specific means of connecting heating element 276, such as contact pads and electrical lines, are not illustrated in FIG. 8A. Heat generated by heating element 276 increases the temperature of arm 267 of group IV optoelectronic device 240. This increase in temperature in turn increases the effective refractive index of arm 267 of group IV optoelectronic device 240, and is known as the thermal-optical effect. In various implementations, the increase of the refractive index can be on the order of $10^{-4}$ or $10^{-5}$ per degree Celsius.

The dimensions of heating element 276 and its spacing from arm 267 of group IV optoelectronic device 240 can be chosen based on heat generation factors, such as the material of heating element 276 and the power supplied by a voltage source or current source, as well as based on heat transfer factors, such as the thermal conductivity of group IV optoelectronic device 240 and any material situated between heating element 276 and group IV optoelectronic device 240. In one implementation, heating element 276 is situated partially over group IV optoelectronic device 240. In another implementation, is not situated over group IV optoelectronic device 240. In one implementation, the spacing between heating element 276 and group IV optoelectronic device 240 is approximately one micron (1 µm). In the present implementation, heating element 276 has a rectangular shape. In various implementations, heating element 276 can have any other shapes. In various implementations, semiconductor structure 214A can include multiple and/or distributed heating elements. In one implementation, arm 266 is spaced sufficiently far from heating element 276 so as to introduce little or substantially no change in the refractive index of arm 266 compared to the change in refractive index of arm 267.

Figure 8B:
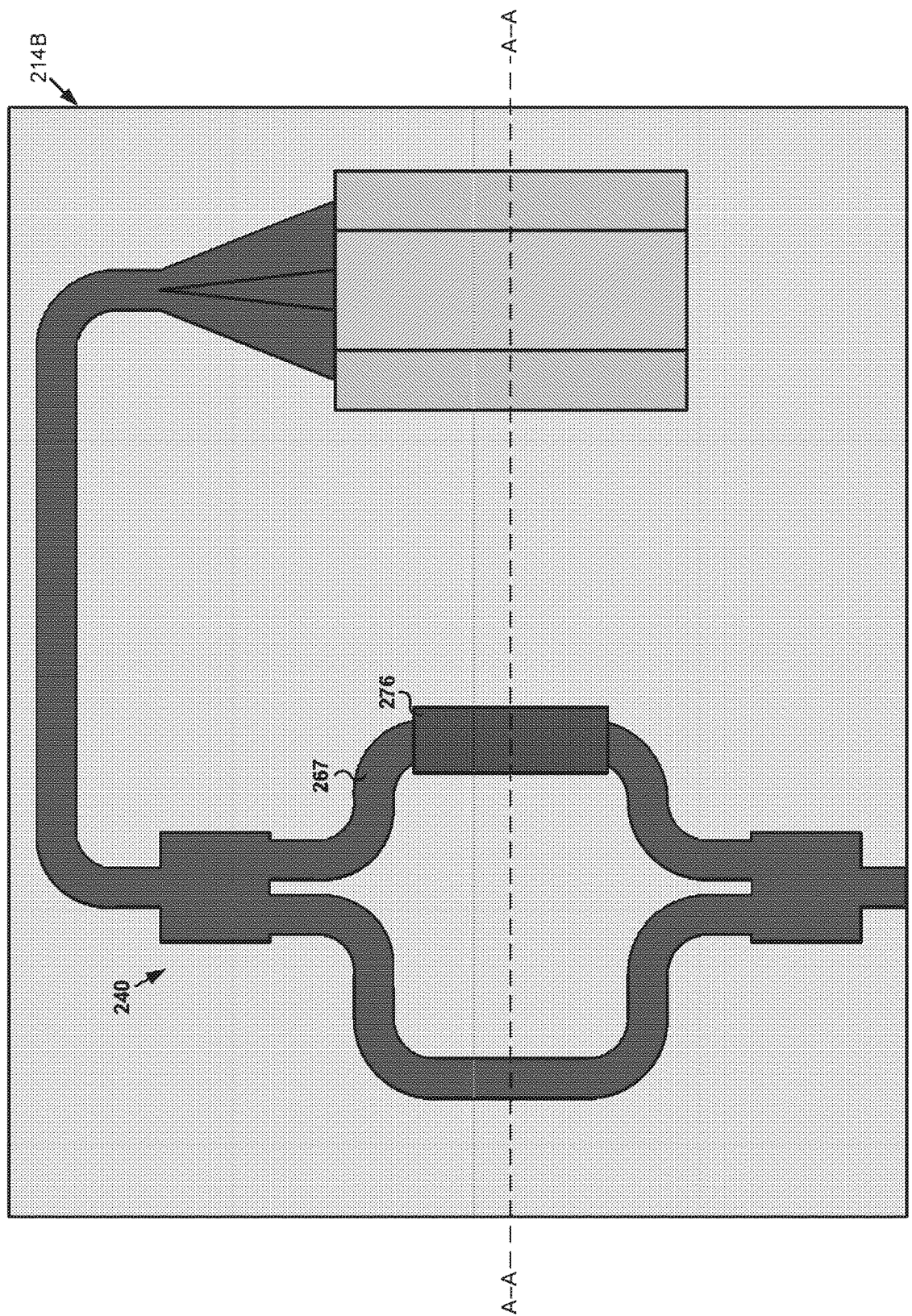
FIG. 8B illustrates a layout of a portion of a semiconductor structure corresponding to FIG. 8A processed in accordance with the flowchart of FIG. 1B according to one implementation of the present application.

FIG. 8B illustrates a layout of a portion of a semiconductor structure corresponding to FIG. 8A processed in accordance with action 114 in the flowchart of FIG. 1B according to one implementation of the present application. FIG. 8A represents a cross-sectional view along line "A-A" in FIG. 8B. As shown in FIG. 8B, in semiconductor structure 214B, heating element 276 is formed near group IV optoelectronic device 240. In the present implementation, heating element 276 is situated over arm 267 of group IV optoelectronic device 240 and on oxide layer 244 (shown in FIG. 8A).

FIG. 9 illustrates a cross-sectional view of a portion of a semiconductor structure processed in accordance with action 116 in the flowchart of FIG. 1B according to one implementation of the present application. As shown in FIG. 9, in semiconductor structure 216, dielectric layer 260 is formed over patterned group III-V optoelectronic device 256, over heating element 276, and over portions of group IV substrate 230.

In various implementations, dielectric layer 260 is $SiO_2$, $Si_xN_y$, or another dielectric. Dielectric layer 260 can be formed, for example, by depositing a blanket dielectric using plasma enhanced chemical vapor deposition (PECVD) or high density plasma CVD (HDP-CVD), and then planarizing the blanket dielectric, for example, by CMP. In group III-V chiplet 246, the topography of the blanket dielectric layer would generally mirror that of patterned group III-V optoelectronic device 256, and protrude in a region above group III-V mesa 258. In order to ensure that dielectric layer 260 is planar and covers group III-V mesa 258, in one implementation, a deposition thickness of the blanket dielectric can be significantly greater than a height of group III-V mesa 258. For example, the deposition thickness of the blanket dielectric can be approximately three microns (3 µm) or greater.

Forming and planarizing dielectric layer 260 over patterned group III-V optoelectronic device 256 as shown in FIG. 9 allows subsequent masks, subsequent etches, and subsequent metal formations to be performed with more reliable alignment, and allows other planar layers to be deposited above semiconductor structure 216. It is noted that, while action 116 results in dielectric layer 260 being substantially planar, dielectric layer 260 may not necessarily have uniform thickness along semiconductor structure 216. For example, due to normal process variations associated with planarization, a thickness of dielectric layer 260 overlying group IV optoelectronic device 240 can be greater than a thickness of dielectric layer 260 overlying patterned group III-V optoelectronic device 256.

Figure 10A:
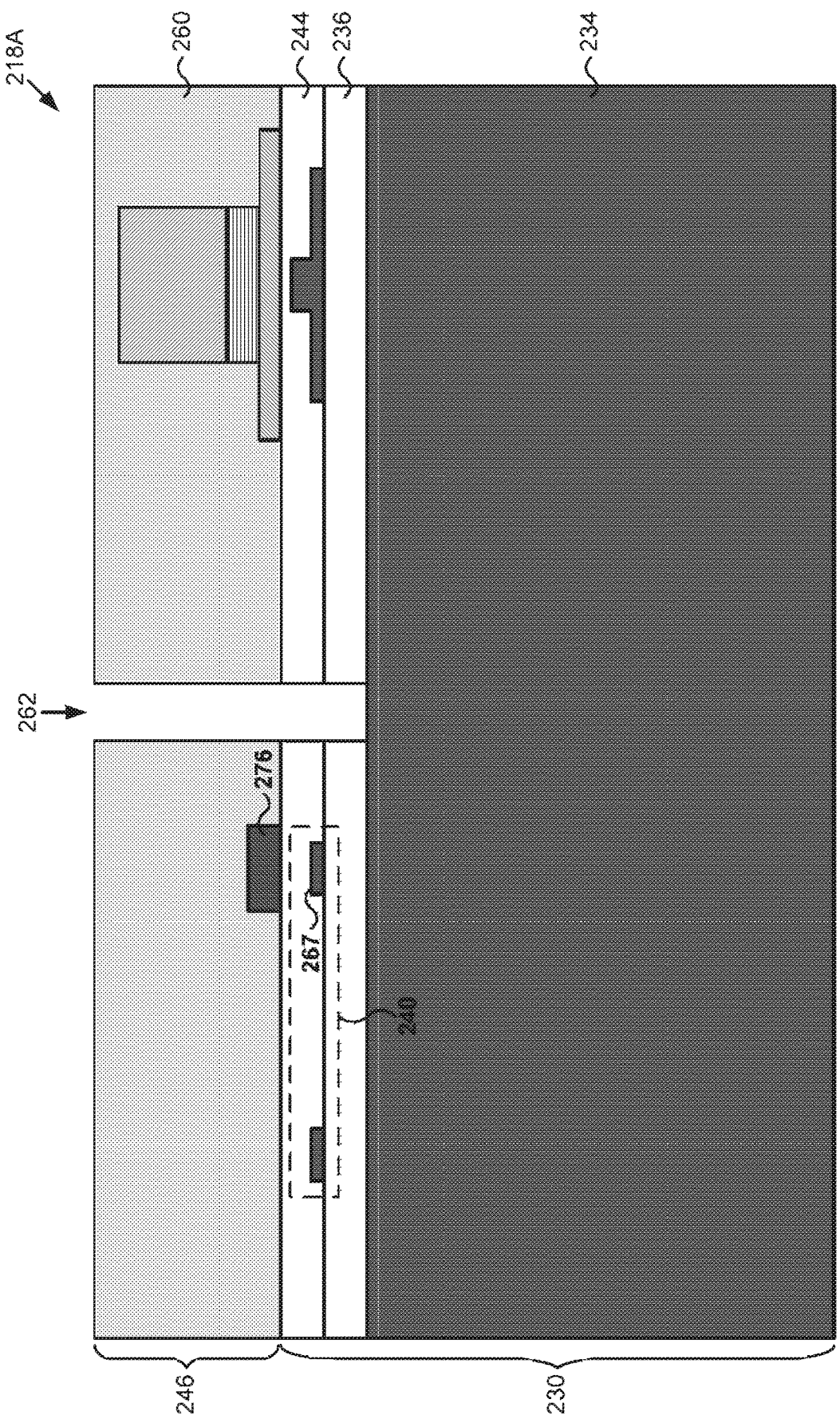
FIG. 10A illustrates a cross-sectional view of a portion of a semiconductor structure processed in accordance with the flowchart of FIG. 1B according to one implementation of the present application.

FIG. 10A illustrates a cross-sectional view of a portion of a semiconductor structure processed in accordance with action 118 in the flowchart of FIG. 1B according to one implementation of the present application. As shown in FIG. 10A, in semiconductor structure 218A, venting hole 262 is formed in dielectric layer 260 in proximity of heating element 276. Venting hole 262 is also situated in proximity of arm 267 of group IV optoelectronic device 240.

Venting hole 262 extends through dielectric layer 260 in group III-V chiplet 246, and through oxide layer 244 and BOX 236 in group IV substrate 230, to handle wafer 234. Venting hole 262 can be formed, for example, using a fluorine-based anisotropic etch. Venting hole 262 can be formed using an etch that is selective to handle wafer 234 and/or using a timed etch that is not selective to handle wafer 234. Venting hole 262 is formed in proximity of heating element 276 such that a cavity formed in a subsequent action would significantly reduce heat dissipation from heating element 276 to group IV substrate 230. In one implementation, the proximity of venting hole 262 and heating element 276 is determined based on a process parameter of the etching action. For example, where the accuracy of the etching action can only form sidewalls of venting hole 262 within five hundred nanometers (500 nm), the proximity of venting hole 262 and heating element 276 can be greater than or approximately five hundred nanometers (500 nm), or a multiple thereof, to ensure that heating element 276 is not damaged in the etching action. In one implementation, venting hole 262 can be situated closer to heating element 276 than all other devices in semiconductor structure 218A. In various implementations, semiconductor structure 218A can include multiple venting holes.

Figure 10B:
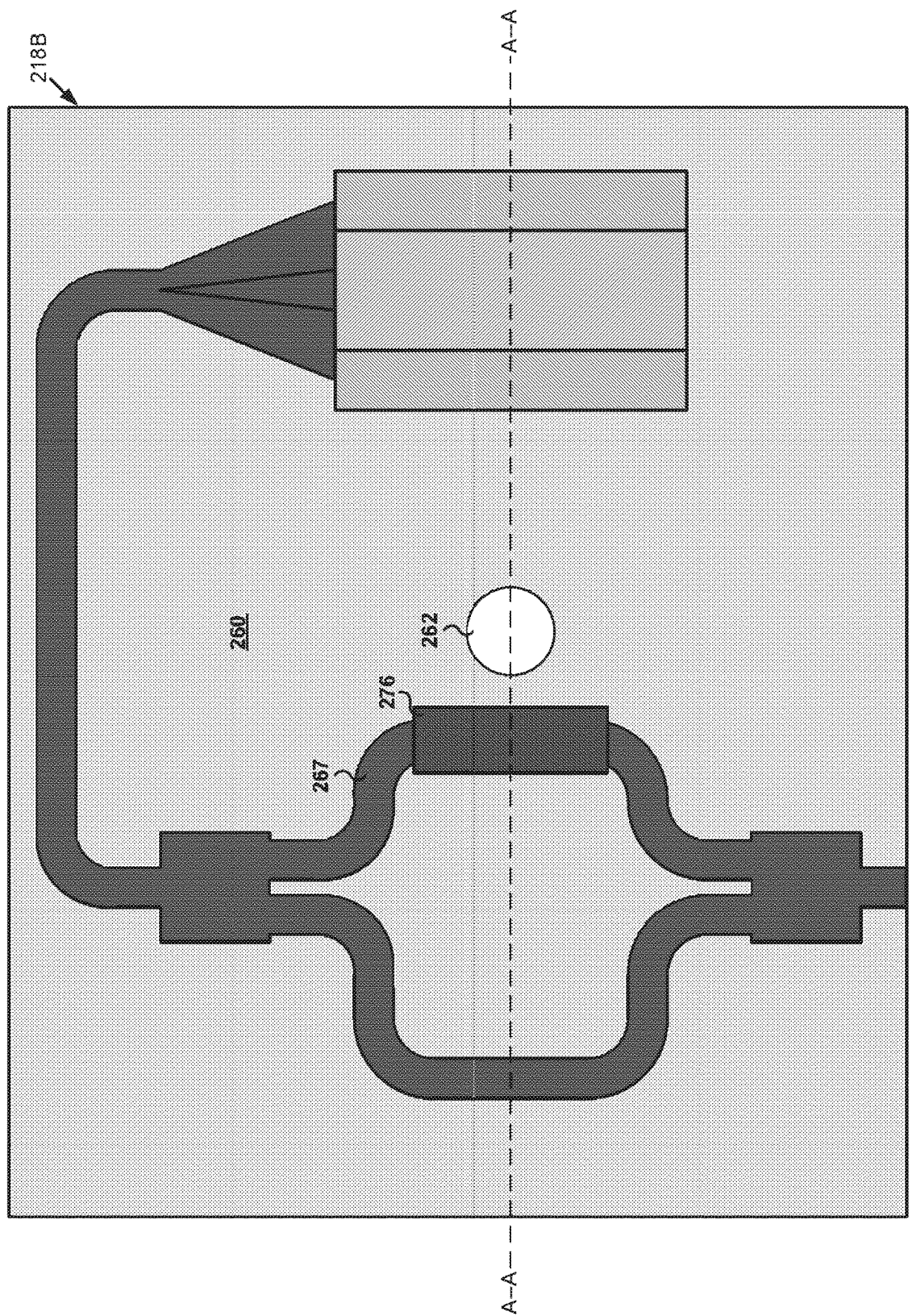
FIG. 10B illustrates a layout of a portion of a semiconductor structure corresponding to FIG. 10A processed in accordance with the flowchart of FIG. 1B according to one implementation of the present application.

FIG. 10B illustrates a layout of a portion of a semiconductor structure corresponding to FIG. 10A processed in accordance with action 118 in the flowchart of FIG. 1B according to one implementation of the present application. FIG. 10A represents a cross-sectional view along line "A-A" in FIG. 10B. As shown in FIG. 10B, in semiconductor structure 218B, venting hole 262 is formed in dielectric layer 260 in proximity of heating element 276 and arm 267 of group IV optoelectronic device 240. In the present implementation, the aperture of venting hole 262 has a circular shape. In various implementations, the aperture of venting hole 262 can have a rectangular shape, or any other shape.

Figure 11A:
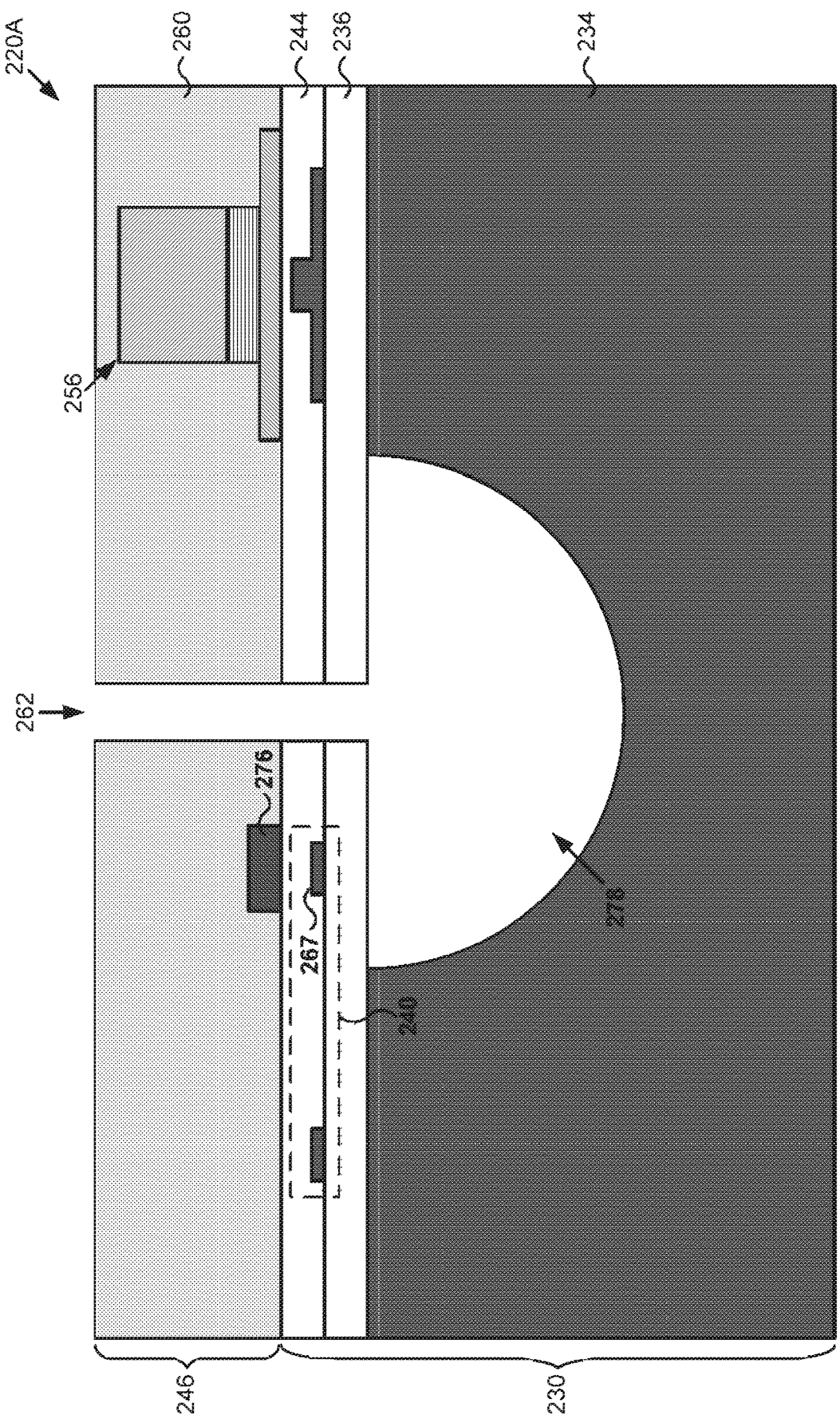
FIG. 11A illustrates a cross-sectional view of a portion of a semiconductor structure processed in accordance with the flowchart of FIG. 1B according to one implementation of the present application.

FIG. 11A illustrates a cross-sectional view of a portion of a semiconductor structure processed in accordance with the flowchart of FIG. 1B according to one implementation of the present application. As shown in FIG. 11A, in semiconductor structure 220A, venting hole 262 is utilized to form cavity 278 in group IV substrate 230 in proximity of heating element 276.

Cavity 278 is situated in handle wafer 234 of group IV substrate and contiguous with venting hole 262. An isotropic dry plasma etch, for example, using sulfur hexafluoride (SF$_6$), can be utilized to form cavity 278. Cavity 278 can be formed using an etch that is selective to handle wafer 234 such that BOX 236 remains substantially unetched. In the present implementation, cavity 278 is substantially spherical. In various implementations, a radius of cavity 278 can range from approximately twenty microns to approximately fifty microns (20 μm-50 μm). Notably, cavity 278 is not etched to the backside of group IV substrate 230, to avoid cracking and/or mechanical instability. In the present implementation, cavity 278 is filled with air. In one implementation, after forming cavity 278, venting hole 262 can be sealed, for example, by depositing a dielectric using a non-conformal low gap-fill process, such as CVD, that causes the dielectric to pinch-off venting hole 262 near the top of venting hole 262. In various implementations, cavity 278 can be filled with a material other than air.

Cavity 278 is formed in proximity to heating element 276. In particular, heating element 276 is situated over cavity 278 with BOX 236 and oxide layer 244 therebetween. The timing of an etching action utilized to form cavity 278 can be controlled to ensure that cavity 278 is situated under heating element 276. Cavity 278 in proximity to heating element 276 significantly reduces heat dissipation from heating element 276 to group IV substrate 230. For example, in one implementation, handle wafer 234 can be monocrystalline Si, and its thermal conductivity can be approximately one hundred seventy watts per meter-kelvin (170 W/(m·K)). In contrast, cavity 278 can be filled with air, and its thermal conductivity can be approximately twenty five milliwatts per meter-kelvin (0.025 W/(m·K)). Because cavity 278 has lower thermal conductivity compared to handle wafer 234, the effective thermal conductivity of group IV substrate 230 is reduced. Less heat dissipates from heating element 276 to group IV substrate 230, and heating element 276 requires less power to achieve a desired refractive index in arm 267 of group IV optoelectronic device 240.

In the present implementation, cavity 278 is also situated under arm 267 of group IV optoelectronic device 240. As a result, cavity 278 further reduces heat dissipation from group IV optoelectronic device 240. In various implementations, more or less of group IV optoelectronic device 240 can be situated over cavity 278. In the present implementation, cavity 278 is not situated in proximity to patterned group III-V optoelectronic device 256, to prevent overheating of patterned group III-V optoelectronic device 256.

Figure 11B:
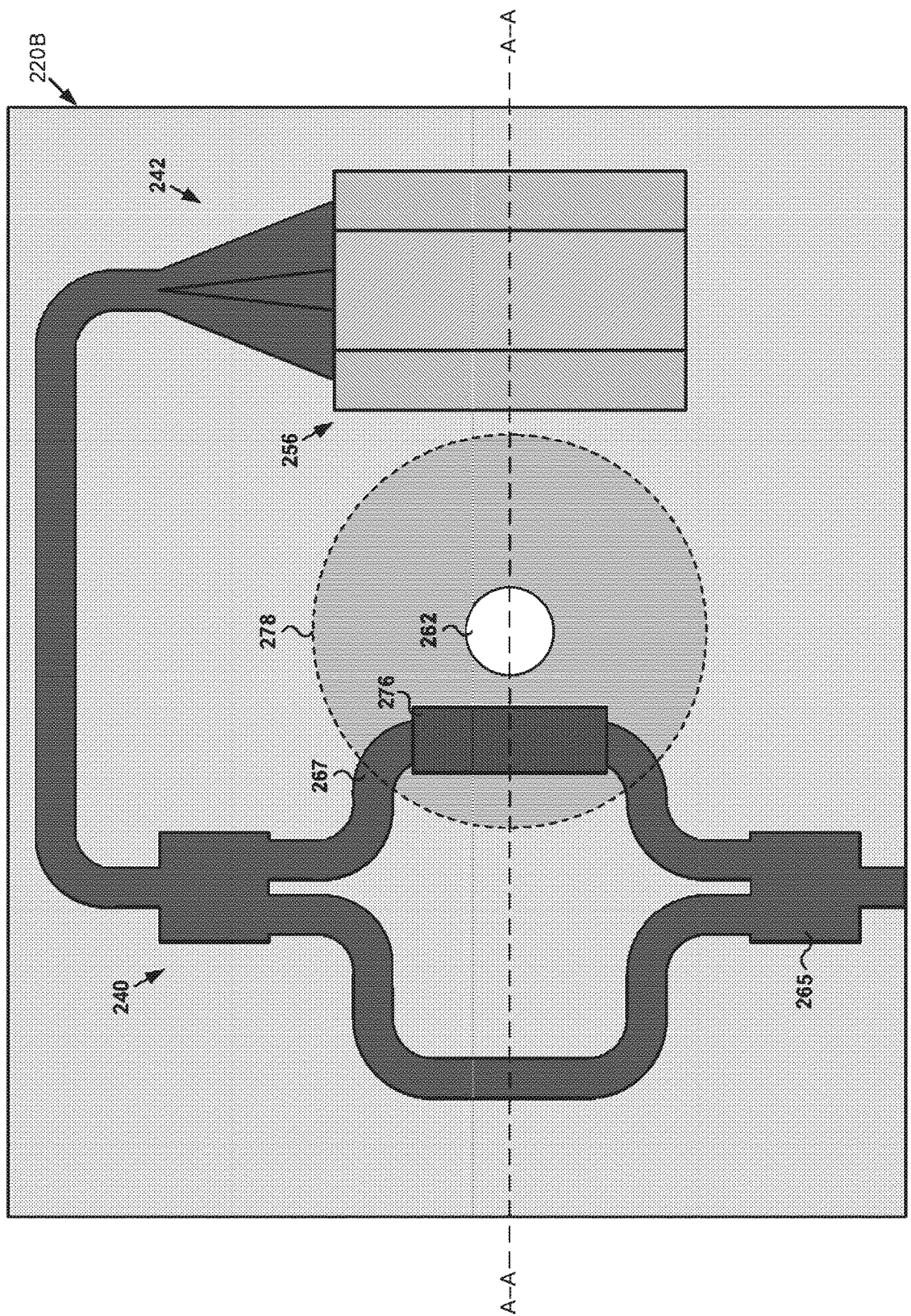
FIG. 11B illustrates a layout of a portion of a semiconductor structure corresponding to FIG. 11A processed in accordance with the flowchart of FIG. 1B according to one implementation of the present application.

FIG. 11B illustrates a layout of a portion of a semiconductor structure corresponding to FIG. 11A processed in accordance with action 120 in the flowchart of FIG. 1B according to one implementation of the present application. FIG. 11A represents a cross-sectional view along line "A-A" in FIG. 11B. As shown in FIG. 11B, in semiconductor structure 220B, venting hole 262 is utilized to form cavity 278 in group IV substrate 230 (shown in FIG. 11A) in proximity to heating element 276. Cavity 278 is also situated under heating element 276 and arm 267 of group IV optoelectronic device 240. Cavity 278 is illustrated with dashed lines as seen through various structures of semiconductor structure 220B.

Figure 12A:
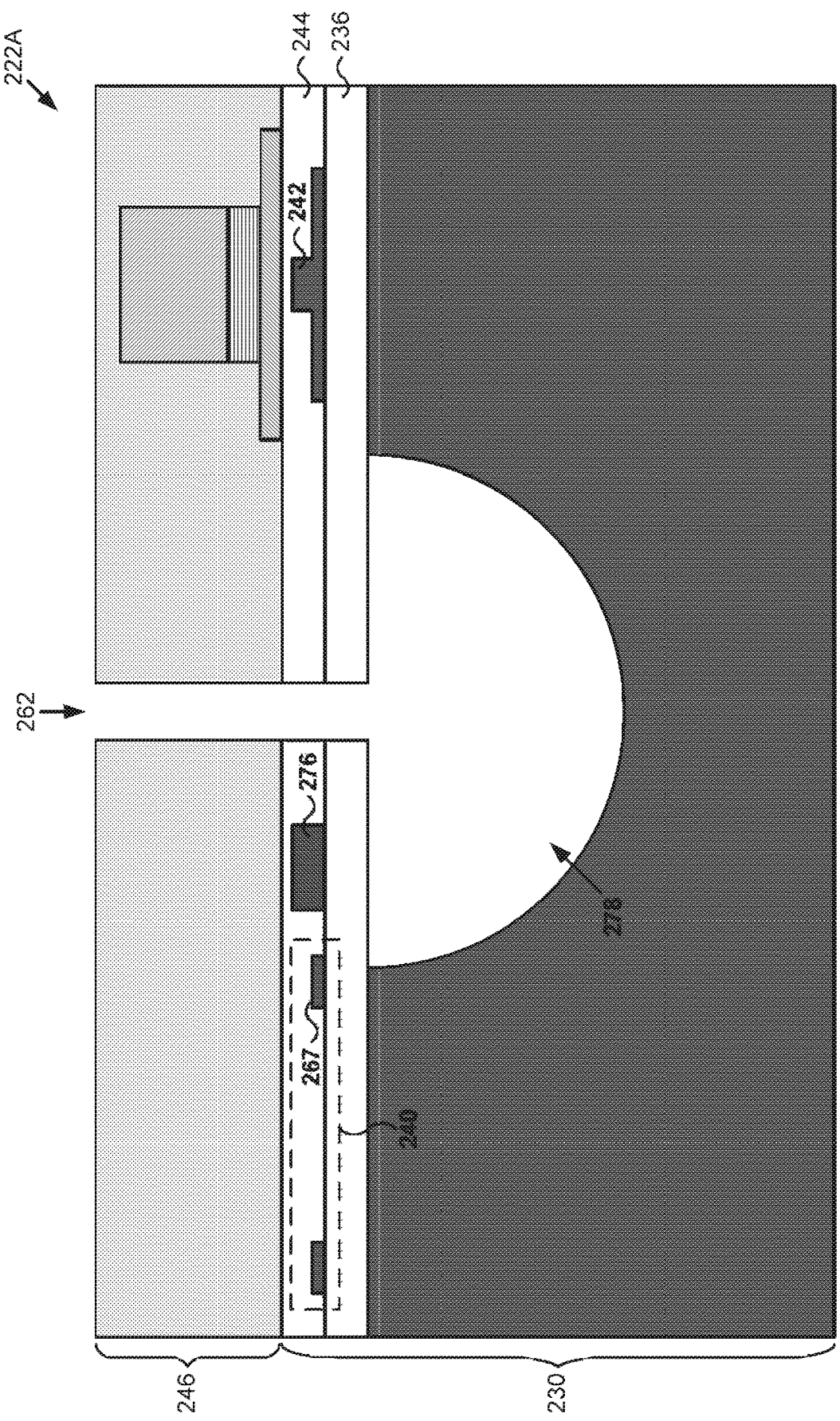
FIG. 12A illustrates a cross-sectional view of a portion of a semiconductor structure according to an alternative implementation of the present application.

FIG. 12A illustrates a cross-sectional view of a portion of a semiconductor structure according to an alternative implementation of the present application. In semiconductor structure 222A in FIG. 12A, heating element 276 is situated in group IV substrate 230, rather than in group III-V chiplet 246 (as shown in FIG. 11A).

Heating element 276 is situated over BOX 236 near group IV optoelectronic device 240, and in particular, laterally adjacent to arm 267. Venting hole 262 is situated in proximity of heating element 276. Cavity 278 is in proximity to heating element 276. In particular, heating element 276 is situated over cavity 278 with BOX 236 therebetween. Heating element 276 can be formed in group IV substrate 230 after forming group IV optoelectronic device 240 and group IV optical device 242. In one implementation, heating element 276 can comprise a doped semiconductor, such as doped Si. In this implementation, heating element 276 can be patterned from top semiconductor 238 (shown in FIG. 2) concurrently with group IV optoelectronic device 240 and/or group IV optical device 242, then heating element 276 can be selectively doped. In another implementation, heating element 276 can comprise a silicide, such as nickel silicide. In yet another implementation, heating element 276 can be formed by a damascene process or a metal etch process.

Then, oxide layer 244 can be formed over group IV optoelectronic device 240, group IV optical device 242, and heating element 276. In other words, semiconductor structure 222A can be processed in accordance with the flowcharts of FIGS. 1A and 1B, in an implementation where action 114 occurs before action 106. Oxide layer 244 can protect heating element 276 during bonding action 108 (shown in FIG. 5). In various implementations, heating element 276 can be formed in group IV substrate 230 near group IV optoelectronic device 240 in any other manner. Except for differences described above, semiconductor structure 222A in FIG. 12A generally corresponds to semiconductor structure 220A in FIG. 1A, and may have any implementations and advantages described above.

Figure 12B:
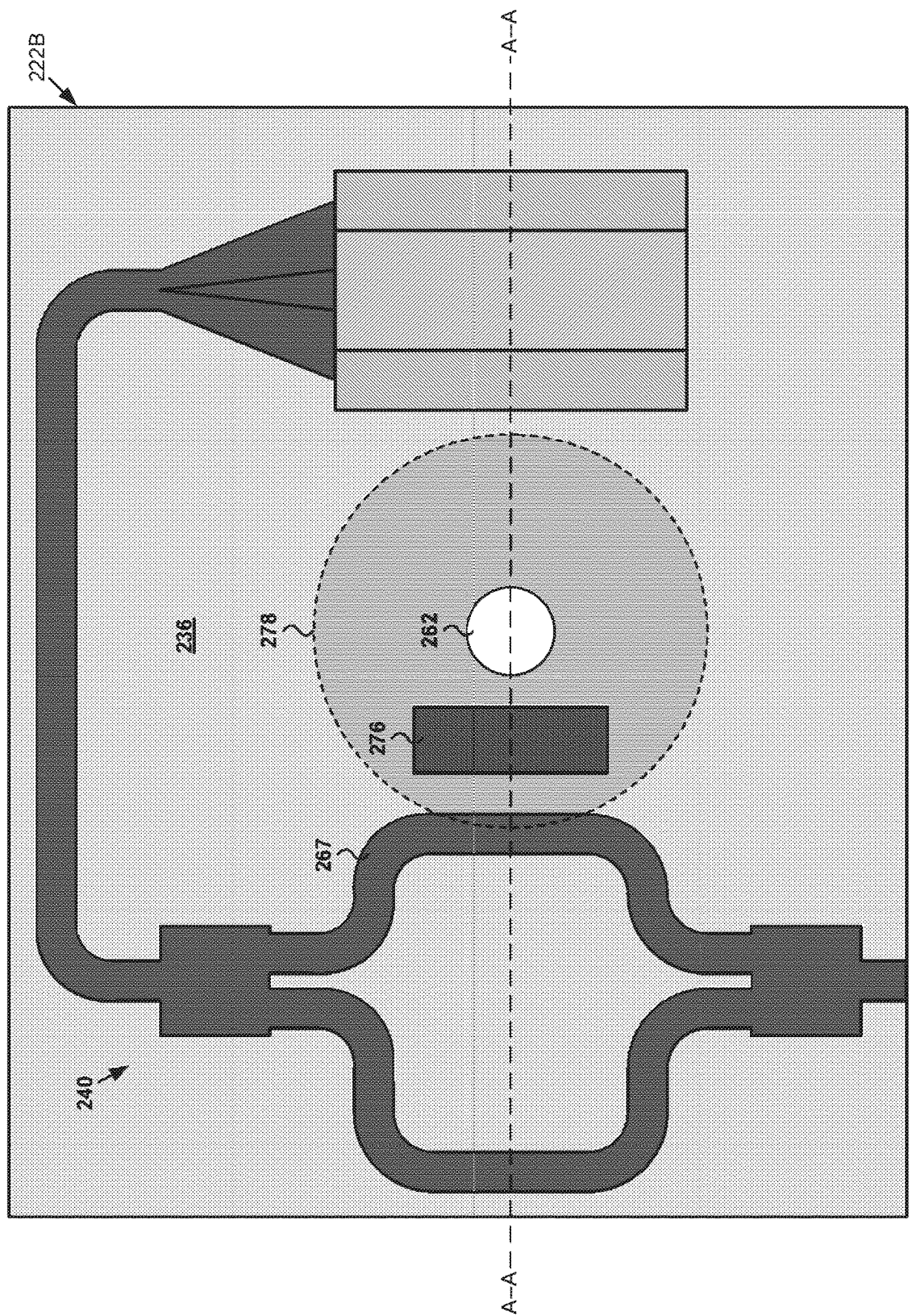
FIG. 12B illustrates a layout of a portion of a semiconductor structure corresponding to FIG. 12A according to an alternative implementation of the present application.

FIG. 12B illustrates a layout of a portion of a semiconductor structure corresponding to FIG. 12A according to an alternative implementation of the present application. FIG. 12A represents a cross-sectional view along line "A-A" in FIG. 12B. As shown in FIG. 12B, in semiconductor structure 222B, heating element 276 is situated in group IV substrate 230 (shown in FIG. 12A) over BOX 236, and laterally adjacent to arm 267 of group IV optoelectronic device 240. Venting hole 262 is situated in proximity of heating element 276. Cavity 278 is also situated under heating element 276 and partially under arm 267 of group IV optoelectronic device 240. In another implementation, cavity 278 is not situated under arm 267. Cavity 278 is illustrated with dashed lines as seen through various structures of semiconductor structure 222B in FIG. 12B. Except for differences described above, semiconductor structure 222B in FIG. 12B generally corresponds to semiconductor structure 220B in FIG. 11B, and may have any implementations and advantages described above.

Figure 13:
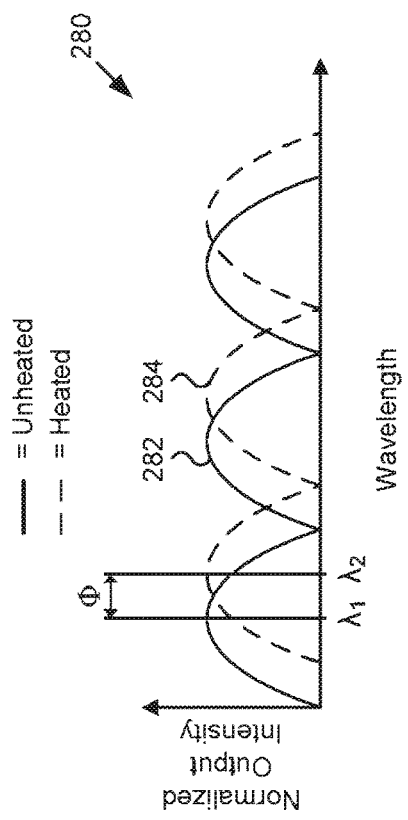
FIG. 13 illustrates an exemplary graph of output intensity versus wavelength according to one implementation of the present application.

FIG. 13 illustrates an exemplary graph of normalized output intensity versus wavelength according to one implementation of the present application. The intensity-wavelength graph 280 in FIG. 13 represents the normalized intensity of light output by a group IV optoelectronic device, such as at output combiner 265 of group IV optoelectronic device 240 in FIG. 11B, plotted over wavelength. Accordingly, graph 280 in FIG. 13 is described below with reference to semiconductor structure 220B in FIG. 11B.

Where patterned group III-V optoelectronic device 256 is a laser, light output by patterned group III-V optoelectronic device 256 can have a wide band. Group IV optical device 242 optically couples the light to group IV optoelectronic device 240. Where group IV optoelectronic device 240 is an interferometer, group IV optoelectronic device 240 effectively filters the light, changing the intensity of the light to have narrow bands. As shown by trace 282 in FIG. 13, light output by group IV optoelectronic device 240 can have narrow bands. In trace 282, a peak intensity of an exemplary narrow band is shown to occur as wavelength $\lambda_1$.

The peak at wavelength $\lambda_1$ might be off from a desired wavelength for a given application, for example, due to normal process variations associated with operating patterned group III-V optoelectronic device 256 and/or due to normal process variations associated with fabricating patterned group III-V optoelectronic device 256, group IV optical device 242, or group IV optoelectronic device 240. When heating element 276 is supplied with power and generates heat, the thermo-optical effect increases the refractive index of arm 267 of group IV optoelectronic device 240. In turn, group IV optoelectronic device 240 changes the intensity in a different manner. As shown by trace 284 in FIG. 13, light output by group IV optoelectronic device 240 when heating element 276 is supplied with power can have narrow bands at different peaks compared to when heating element 276 is not supplied with power. In trace 284, a peak intensity of an exemplary narrow band is now shown to occur as wavelength $\lambda_2$. Phase shift $\Phi$ represents the difference between wavelength $\lambda_1$ and wavelength $\lambda_2$. As described below, the magnitude of phase shift $\Phi$ generally corresponds to the power supplied to heating element 276. Thus, heating element 276 in semiconductor structure 220B can shift output light band peaks (or troughs) to a desired wavelength for a given application. As a result, the output light may be processed more easily, for example, by modulators and/or encoders (not shown).

Figure 14:
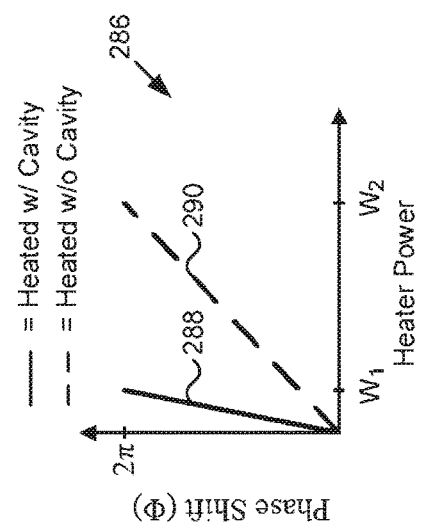
FIG. 14 illustrates an exemplary graph of phase shift versus heater power according to one implementation of the present application.

FIG. 14 illustrates an exemplary graph of phase shift versus heater power according to one implementation of the present application. The shift-power graph 286 in FIG. 14 represents the magnitude of phase shift $\Phi$ provided by a group IV optoelectronic device, such as at output combiner 265 of group IV optoelectronic device 240 in FIG. 11B, plotted over the power provided to a heating element, such as at heating element 276 in FIG. 11B, situated near the group IV optoelectronic device. Accordingly, graph 286 in FIG. 14 is described below with reference to semiconductor structure 220B in FIG. 11B.

Trace 288 represents the phase shift $\Phi$ versus heater power in semiconductor structure 220B that includes venting hole 262 and cavity 278. Trace 290 represents the phase shift $\Phi$ versus heater power in another semiconductor structure that does not include venting hole 262 and cavity 278. As shown by traces 288 and 290, the magnitude of phase shift $\Phi$ generally corresponds to the power supplied to heating element 276. In various implementations, traces 288 and 290 may exhibit relationships other than those shown in FIG. 14, such as different or non-linear slopes.

However, the semiconductor structure that does not include venting hole 262 and cavity 278 requires more power to achieve the same phase shift $\Phi$ as semiconductor structure 220B that includes venting hole 262 and cavity 278. As shown by trace 288, semiconductor structure 220B achieves phase shift $\Phi$ of $2\pi$ using a heater power of Wt. In contrast, as shown by trace 290, the semiconductor structure that does not include venting hole 262 and cavity 278 achieves phase shift $\Phi$ of $2\pi$ using a significantly higher heater power of $W_2$. As described above, semiconductor structure 220B requires less power from heating element 276 because less heat dissipates to group IV substrate 230 (shown in FIG. 11A), and more heat is utilized to adjust the refractive index in arm 267 of group IV optoelectronic device 240.

In one implementation, a feedback system (not shown) can be coupled to output combiner 265 of group IV optoelectronic device 240 to dynamically control the power supplied to heating element 276. For example, if phase shift $\Phi$ drops below a desired amount, for example, due to environmental changes, the feedback system can automatically increase the heater power.

Figure 15A:
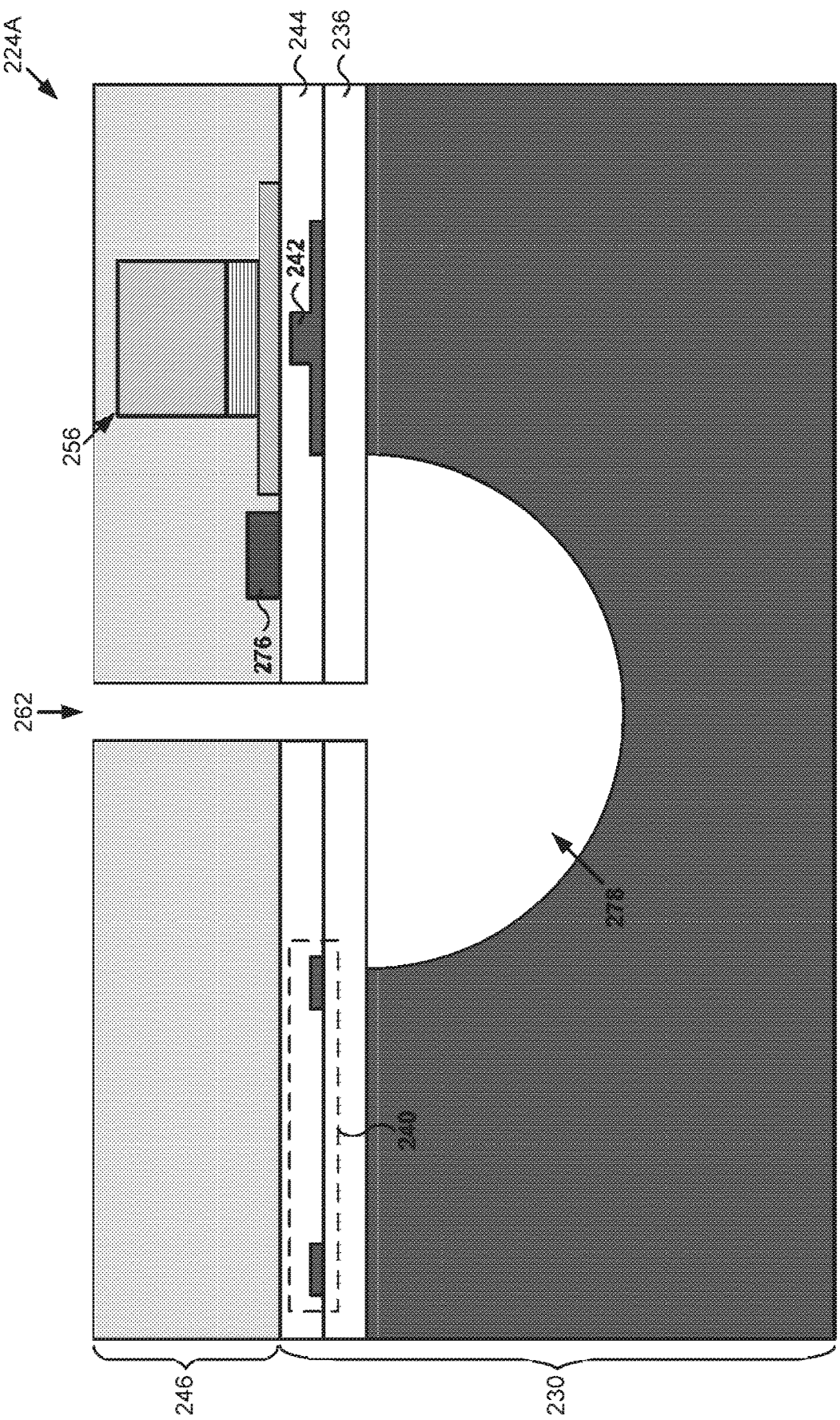
FIG. 15A illustrates a cross-sectional view of a portion of a semiconductor structure according to an alternative implementation of the present application.

FIG. 15A illustrates a cross-sectional view of a portion of a semiconductor structure according to an alternative implementation of the present application. In semiconductor structure 224A in FIG. 15A, heating element 276 is situated near patterned group II-V optoelectronic device 256, rather than near group IV optoelectronic device 240 (as shown in FIG. 11A).

Heating element 276 is situated on oxide layer 244 laterally adjacent to patterned group III-V optoelectronic device 256. Venting hole 262 is situated in proximity of heating element 276. Venting hole 262 is also situated between heating element 276 and group IV optoelectronic device 240. Cavity 278 is in proximity to heating element 276. In particular, heating element 276 is situated over cavity 278 with BOX 236 and oxide layer 244 therebetween. Heating element 276 can be formed using any techniques described above. Because heating element 276 is situated near patterned group III-V optoelectronic device 256, heating element can be utilized to induce a thermal-optical effect in group IV optical device 242, rather than in group IV optoelectronic device 240 (as shown in FIG. 11A). In one implementation, heating element 276 is situated near group IV optical device 242 and induces a thermal-optical effect in group IV optical device 242. In one implementation, heating element 276 may be situated in group IV substrate 230. Except for differences described above, semiconductor structure 224A in FIG. 15A generally corresponds to semiconductor structure 220A in FIG. 11A, and may have any implementations and advantages described above.

Figure 15B:
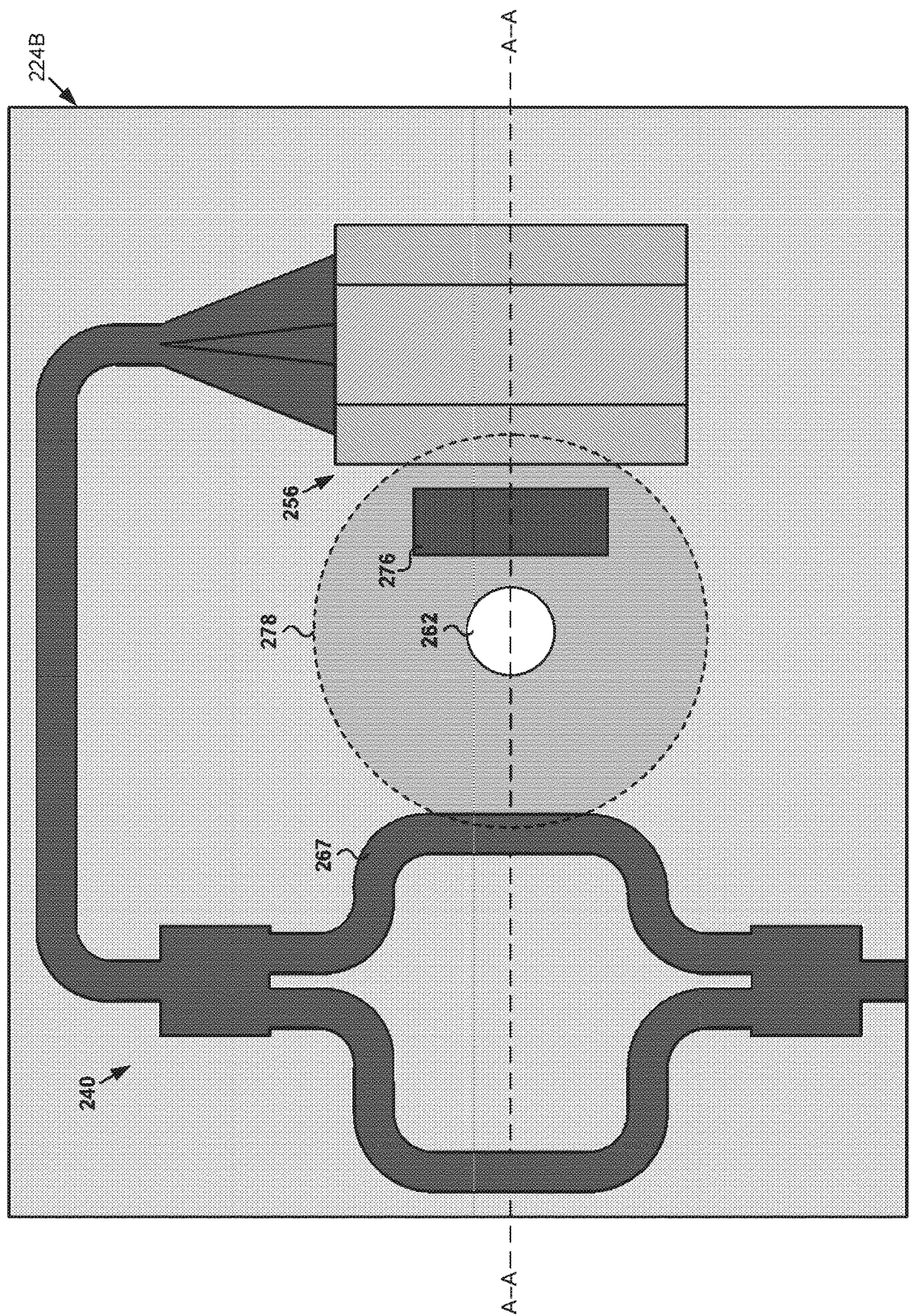
FIG. 15B illustrates a layout of a portion of a semiconductor structure corresponding to FIG. 15A according to an alternative implementation of the present application.

FIG. 15B illustrates a layout of a portion of a semiconductor structure corresponding to FIG. 15A according to an alternative implementation of the present application. FIG. 15A represents a cross-sectional view along line "A-A" in FIG. 15B. As shown in FIG. 15B, in semiconductor structure 224B, heating element 276 is situated near patterned group III-V optoelectronic device 256. Venting hole 262 is situated in proximity of heating element 276. Heating element 276 and group IV optoelectronic device 240 are situated on opposite sides of venting hole 262. Cavity 278 is also situated under heating element 276, partially under arm 267 of group IV optoelectronic device 240, and partially under patterned group III-V optoelectronic device 256. In various implementations, cavity 278 is situated under larger or smaller portions of group IV optoelectronic device 240 and/or patterned group III-V optoelectronic device 256. Cavity 278 is illustrated with dashed lines as seen through various structures of semiconductor structure 224B in FIG. 15B. Except for differences described above, semiconductor structure 224B in FIG. 15B generally corresponds to semiconductor structure 220B in FIG. 11B, and may have any implementations and advantages described above.

Semiconductor structures according to the present invention, such as semiconductor structures 220A and 220B in FIGS. 11A and 11B respectively, result in several advantages. First, patterned group III-V optoelectronic device 256 is integrated in the same semiconductor structure as group IV optoelectronic device 240 and group IV optical device 242 that it is optically connected to. Especially where a portion of oxide layer 244 above group IV optical device 242 is kept thin, patterned group III-V optoelectronic device 256 is in close proximity to group IV optical device 242, and optical losses are reduced.

Second, since patterned group III-V optoelectronic device 256 is patterned after group III-V chiplet 246 is bonded to group IV substrate 230, alignment is improved. Photolithography techniques utilized to form group IV optical device 242 can also be utilized to form patterned group III-V optoelectronic device 256, such that patterned group III-V optoelectronic device 256 is aligned to group IV optical device 242. If a group III-V optoelectronic device were patterned prior to bonding to group IV substrate 230, inaccurate mechanical alignment of the group III-V optoelectronic device during the bonding could cause significant optical losses between the group II-V optoelectronic device and group IV optical device 242.

Third, because dielectric layer 260 is substantially planar, semiconductor structure 220A is compatible with modern group IV back-end-of-line (BEOL) multi-level metallization (MLM) schemes. Forming subsequent metallization levels and interlayer dielectrics over group III-V mesa 258 does not result in extreme topographies and contours, making lithographic alignment simple, and significantly decreasing the complexity when connecting to overlying interconnect metals and vias (not shown).

Fourth, heating element 276 is situated near group IV optoelectronic device 240, and can tune group IV optoelectronic device 240 to a desired phase shift Φ for a given application, as described above. Where a feedback system (not shown) is also utilized, semiconductor structure 220B can automatically tune group IV optoelectronic device 240 to account for dynamics.

Fifth, because semiconductor structure 220A includes cavity 278 in proximity to heating element 276, heating element 276 dissipates significantly less heat to group IV substrate 230, and heating element 276 requires significantly less power to adjust the phase shift Φ in arm 267 of group IV optoelectronic device 240. While venting hole 262 is utilized to form cavity 278, venting hole 262 in proximity of heating element 276 can also slightly increase heat dissipation from heating element 276 to arm 267 of group IV optoelectronic device 240. Moreover, despite heating element 276 dissipating significantly less heat to group IV substrate 230, patterned group III-V optoelectronic device 256 can still successfully dissipate heat to group IV substrate 230 and avoid overheating.

Sixth, fabrication of semiconductor structure 220A is relatively uncomplicated. Cavity 278 is formed using venting hole 262 in dielectric layer 260 on the front of semiconductor structure 220A, and can easily be aligned in proximity to heating element 276. No backside etching and no difficult alignment steps are required. Additionally, since cavity 278 is not etched to the backside of group IV substrate 230, group IV substrate 230 exhibits improved mechanical stability, and can more readily accommodate subsequent molding and/or packaging actions.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A semiconductor structure comprising:
a group IV optoelectronic device situated in a group IV substrate;
a heating element near said group IV optoelectronic device;
a patterned group III-V optoelectronic device over said group IV substrate;
a venting hole in proximity of said heating element;
wherein said venting hole extends through a substantially planar dielectric layer having a thickness greater than said patterned group III-V optoelectronic device, said substantially planar dielectric layer over said patterned group III-V optoelectronic device;
a cavity in said group IV substrate in proximity to said heating element.

2. The semiconductor structure of claim 1, wherein said heating element is situated over said cavity.

3. The semiconductor structure of claim 1, wherein said heating element is situated over said group IV optoelectronic device.

4. The semiconductor structure of claim 1, wherein said heating element comprises a metal selected from the group consisting of tungsten (W), molybdenum (Mo), titanium (Ti), titanium tungsten (TiW), titanium nitride (TiN), tantalum (Ta), tantalum nitride (TaN), and nickel chromium (NiCr), and said heating element is situated laterally adjacent to said group IV optoelectronic device.

5. The semiconductor structure of claim 1, wherein said heating element comprises a metal selected from the group consisting of tungsten (W), molybdenum (Mo), titanium (Ti), titanium tungsten (TiW), titanium nitride (TiN), tantalum (Ta), tantalum nitride (TaN), and nickel chromium (NiCr), and said heating element is situated in said group IV substrate.

6. The semiconductor structure of claim 1, wherein said heating element is situated on a dielectric bonding.

7. The semiconductor structure of claim 1, wherein:
said group IV substrate is a semiconductor-on-insulator (SOI) substrate;

said cavity is situated in a handle wafer of said SOI substrate.

8. The semiconductor structure of claim 1, wherein said patterned group III-V optoelectronic device is optically coupled to said group IV optoelectronic device.

9. The semiconductor structure of claim 1, wherein said patterned group III-V optoelectronic device is optically coupled to a group IV optical device, and said group IV optical device is optically coupled to said group IV optoelectronic device.

10. The semiconductor structure of claim 9, wherein:
said patterned group III-V optoelectronic device is a group III-V laser;
said group IV optical device is a waveguide;
said group IV optoelectronic device is an interferometer.

11. A method comprising:
forming a group IV optoelectronic device in a group IV substrate;
forming a heating element near said group IV optoelectronic device;
bonding a group III-V chiplet to said group IV substrate;
patterning said group III-V chiplet to produce a patterned group III-V optoelectronic device;
forming a venting hole in proximity of said heating element;
wherein said venting hole extends through a substantially planar dielectric layer having a thickness greater than said patterned group III-V optoelectronic device, said substantially planar dielectric layer over said patterned group III-V optoelectronic device;
using said venting hole to form a cavity in said group IV substrate in proximity to said heating element.

12. The method of claim 11, wherein said venting hole is formed by an anisotropic etch.

13. The method of claim 11, wherein said cavity is formed by an isotropic etch.

14. The method of claim 13, wherein said isotropic etch is performed in a handle wafer of said group IV substrate.

15. The method of claim 11, wherein said heating element comprises a metal selected from the group consisting of tungsten (W), molybdenum (Mo), titanium (Ti), titanium tungsten (TiW), titanium nitride (TiN), tantalum (Ta), tantalum nitride (TaN), and nickel chromium (NiCr), and said heating element is situated laterally adjacent to said group IV optoelectronic device.

16. The method of claim 11, wherein said heating element comprises a metal selected from the group consisting of tungsten (W), molybdenum (Mo), titanium (Ti), titanium tungsten (TiW), titanium nitride (TiN), tantalum (Ta), tantalum nitride (TaN), and nickel chromium (NiCr), and said heating element is situated in said group IV substrate.

17. The method of claim 11, further comprising forming a group IV optical device, wherein said patterned group III-V optoelectronic device is optically coupled to said group IV optical device, and said group IV optical device is optically coupled to said group IV optoelectronic device.

18. The method of claim 11, wherein said heating element is situated on a dielectric bonding layer.

19. A semiconductor structure comprising:
a group IV optoelectronic device situated in a group IV substrate;
a patterned group III-V optoelectronic device over said group IV substrate;
a heating element near said patterned group III-V optoelectronic device;
a venting hole in proximity of said heating element;
wherein said venting hole extends through a substantially planar dielectric layer having a thickness greater than said patterned group III-V optoelectronic device, said substantially planar dielectric layer over said patterned group III-V optoelectronic device;
a cavity in said group IV substrate in proximity to said heating element.

20. The semiconductor structure of claim 19, wherein said heating element is situated on a dielectric bonding layer.

* * * * *